(12) United States Patent
Ganitzer et al.

(10) Patent No.: US 11,302,579 B2
(45) Date of Patent: Apr. 12, 2022

(54) COMPOSITE WAFER, SEMICONDUCTOR DEVICE AND ELECTRONIC COMPONENT

(71) Applicant: Infineon Technologies AG, Neubiberg (DE)

(72) Inventors: Paul Ganitzer, Finkenstein (AT);
Carsten von Koblinski, Villach (AT);
Thomas Feil, Villach (AT); Gerald Lackner, Arnoldstein (AT); Jochen Mueller, Regensburg (DE); Martin Poelzl, Ossiach (AT); Tobias Polster, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/874,146

(22) Filed: May 14, 2020

(65) Prior Publication Data

US 2020/0273750 A1 Aug. 27, 2020

Related U.S. Application Data

(62) Division of application No. 16/081,236, filed as application No. PCT/EP2017/054530 on Feb. 27, 2017, now Pat. No. 10,672,664.

(30) Foreign Application Priority Data

Mar. 1, 2016 (DE) .......................... 102016103683.8

(51) Int. Cl.
*H01L 23/48* (2006.01)
*H01L 21/8234* (2006.01)
(Continued)

(52) U.S. Cl.
CPC ........ *H01L 21/8234* (2013.01); *H01L 21/561* (2013.01); *H01L 21/762* (2013.01);
(Continued)

(58) Field of Classification Search
CPC .... H01L 24/14; H01L 23/3135; H01L 21/561
See application file for complete search history.

(56) References Cited

U.S. PATENT DOCUMENTS 5,691,248 A 11/1997 Cronin et al.
8,154,133 B2 4/2012 Koroku et al.
(Continued)

FOREIGN PATENT DOCUMENTS

DE 102012205251 A1 10/2012
DE 102013200761 A1 7/2013

*Primary Examiner* — Hoa B Trinh
(74) *Attorney, Agent, or Firm* — Murphy, Bilak & Homiller, PLLC

(57) ABSTRACT

In an embodiment, a composite semiconductor substrate includes a first polymer layer and a plurality of semiconductor dies having a first surface, a second surface opposing the first surface, side faces extending between the first surface and the second surface and a first metallization structure on the first surface. Edge regions of the first surface and at least portions of the side faces are embedded in the first polymer layer. At least one metallic region of the first metallization structure is exposed from the first polymer layer. A second metallization structure is arranged on the second surface of the plurality of semiconductor dies. A second polymer layer is arranged on edge regions of the second surface of the plurality of semiconductor dies and on the first polymer layer in regions between the side faces of neighbouring ones of the plurality of semiconductor dies.

5 Claims, 26 Drawing Sheets

(51) Int. Cl.
*H01L 21/56* (2006.01)
*H01L 21/78* (2006.01)
*H01L 23/495* (2006.01)
*H01L 21/762* (2006.01)
*H01L 21/768* (2006.01)
*H01L 25/065* (2006.01)
*H01L 23/31* (2006.01)

(52) U.S. Cl.
CPC ........ *H01L 21/76873* (2013.01); *H01L 21/78* (2013.01); *H01L 23/481* (2013.01); *H01L 23/49562* (2013.01); *H01L 25/0655* (2013.01); *H01L 23/3114* (2013.01); *H01L 23/3135* (2013.01); *H01L 2224/06181* (2013.01); *H01L 2224/16245* (2013.01); *H01L 2224/48091* (2013.01); *H01L 2224/48247* (2013.01); *H01L 2224/48465* (2013.01); *H01L 2224/73257* (2013.01); *H01L 2924/181* (2013.01)

(56) References Cited

U.S. PATENT DOCUMENTS

| | | | |
|---|---|---|---|
| 8,237,255 | B2 | 8/2012 | Kim et al. |
| 9,048,233 | B2 * | 6/2015 | Wu .................. H01L 25/50 |
| 9,064,879 | B2 * | 6/2015 | Hung ............... H01L 23/49827 |
| 9,508,623 | B2 | 11/2016 | Suthiwongsunthorn et al. |
| 2003/0143819 | A1 | 7/2003 | Hedler et al. |
| 2004/0113283 | A1 | 6/2004 | Farnworth et al. |
| 2007/0273046 | A1 | 11/2007 | Theuss et al. |
| 2009/0042368 | A1 | 2/2009 | Sekiya et al. |
| 2009/0243097 | A1 | 10/2009 | Koroku et al. |
| 2009/0302465 | A1 | 12/2009 | Huang |
| 2009/0325345 | A1 | 12/2009 | Sasaki et al. |
| 2010/0052142 | A1 | 3/2010 | Tojo et al. |
| 2010/0140782 | A1 | 6/2010 | Kim et al. |
| 2012/0142165 | A1 | 6/2012 | Huang et al. |
| 2013/0037935 | A1 | 2/2013 | Xue et al. |
| 2014/0167209 | A1 | 6/2014 | Meiser et al. |

\* cited by examiner

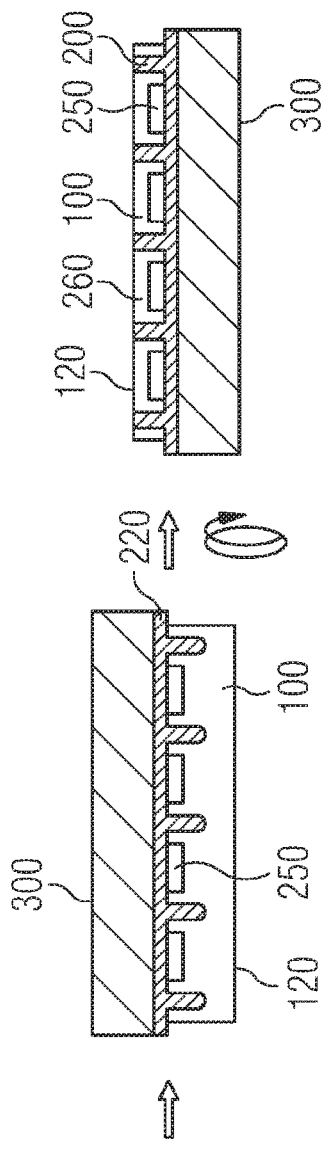
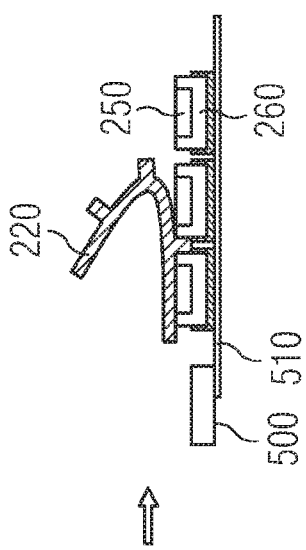

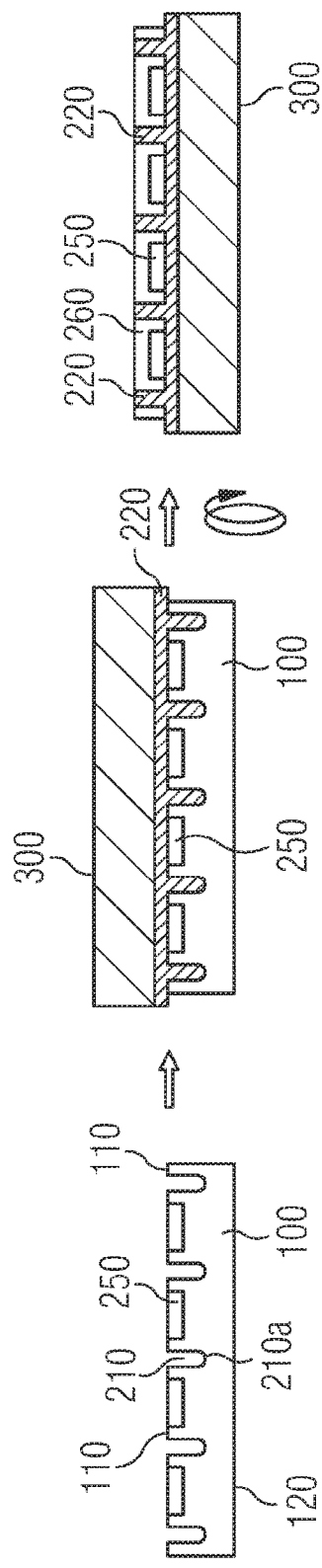

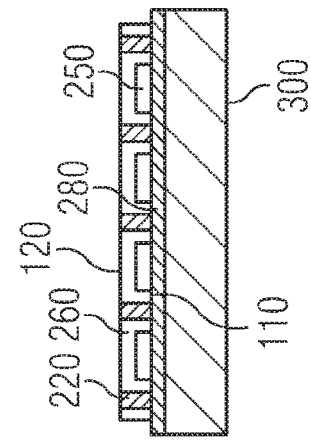
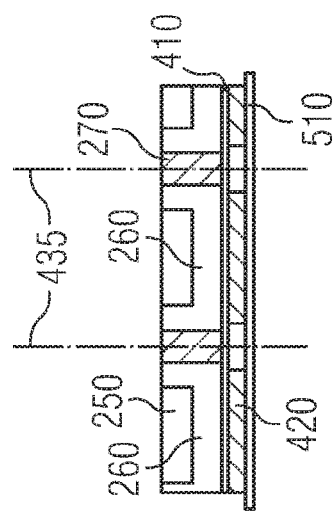
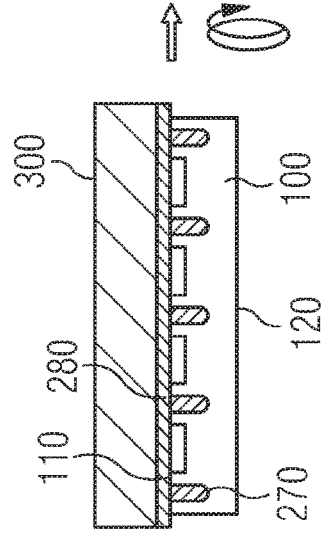
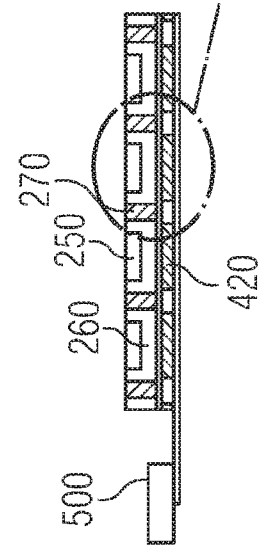
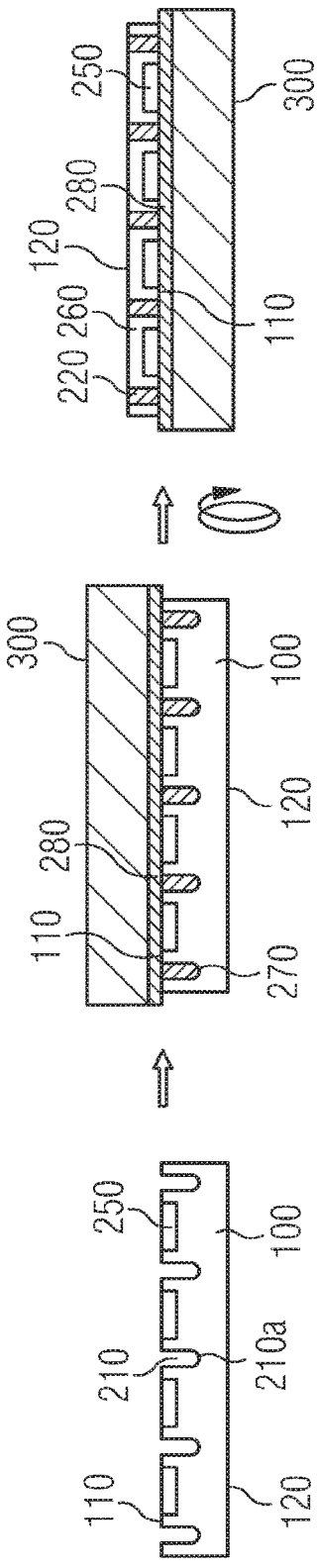
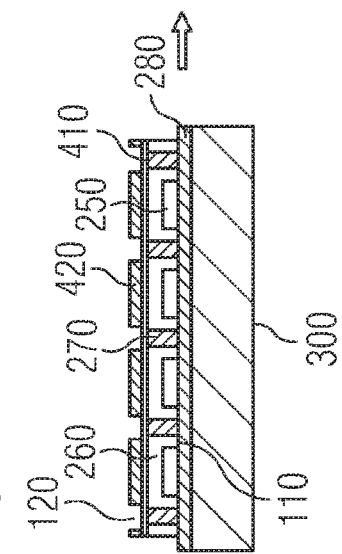

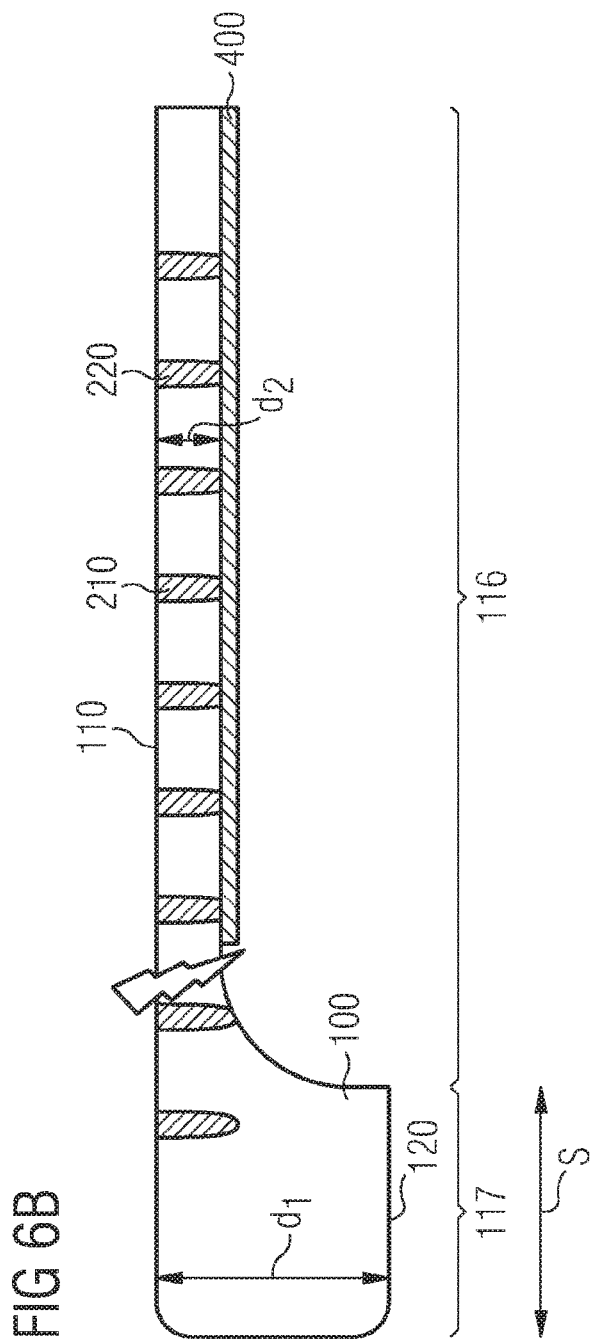

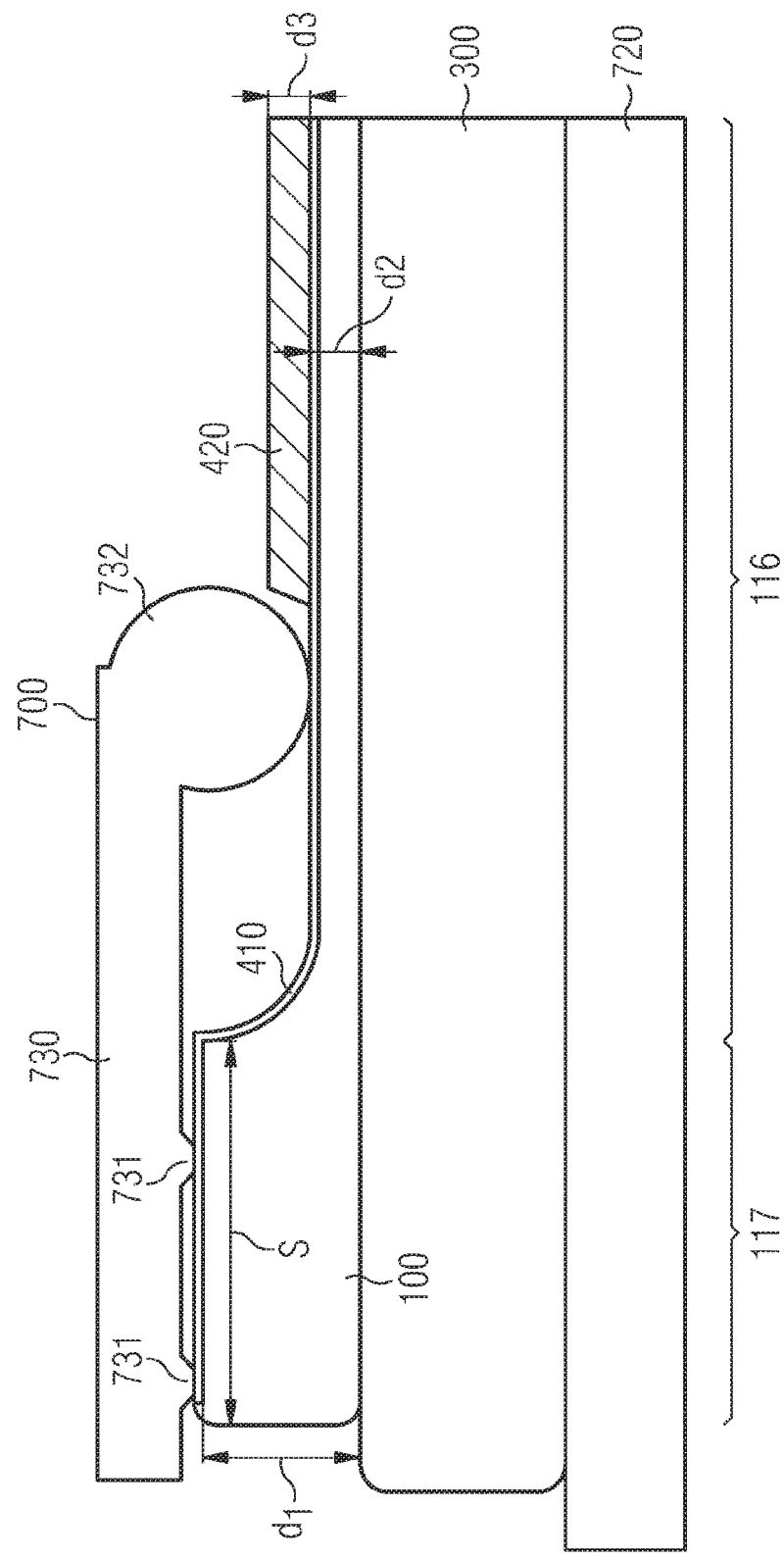

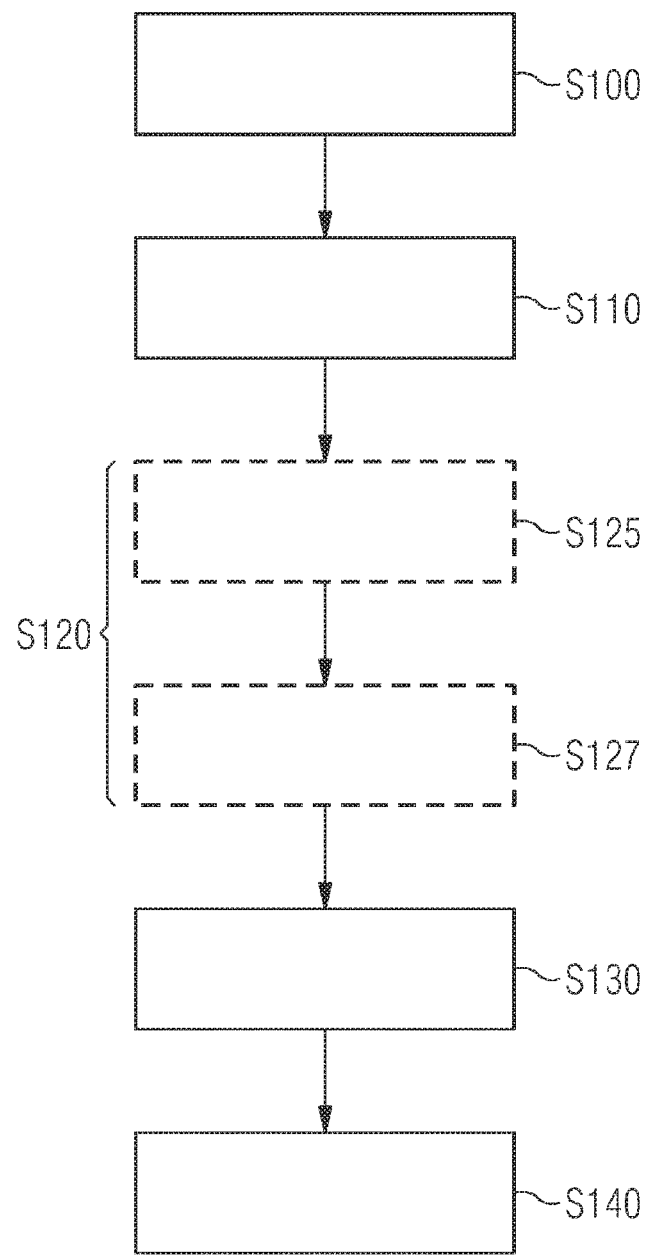

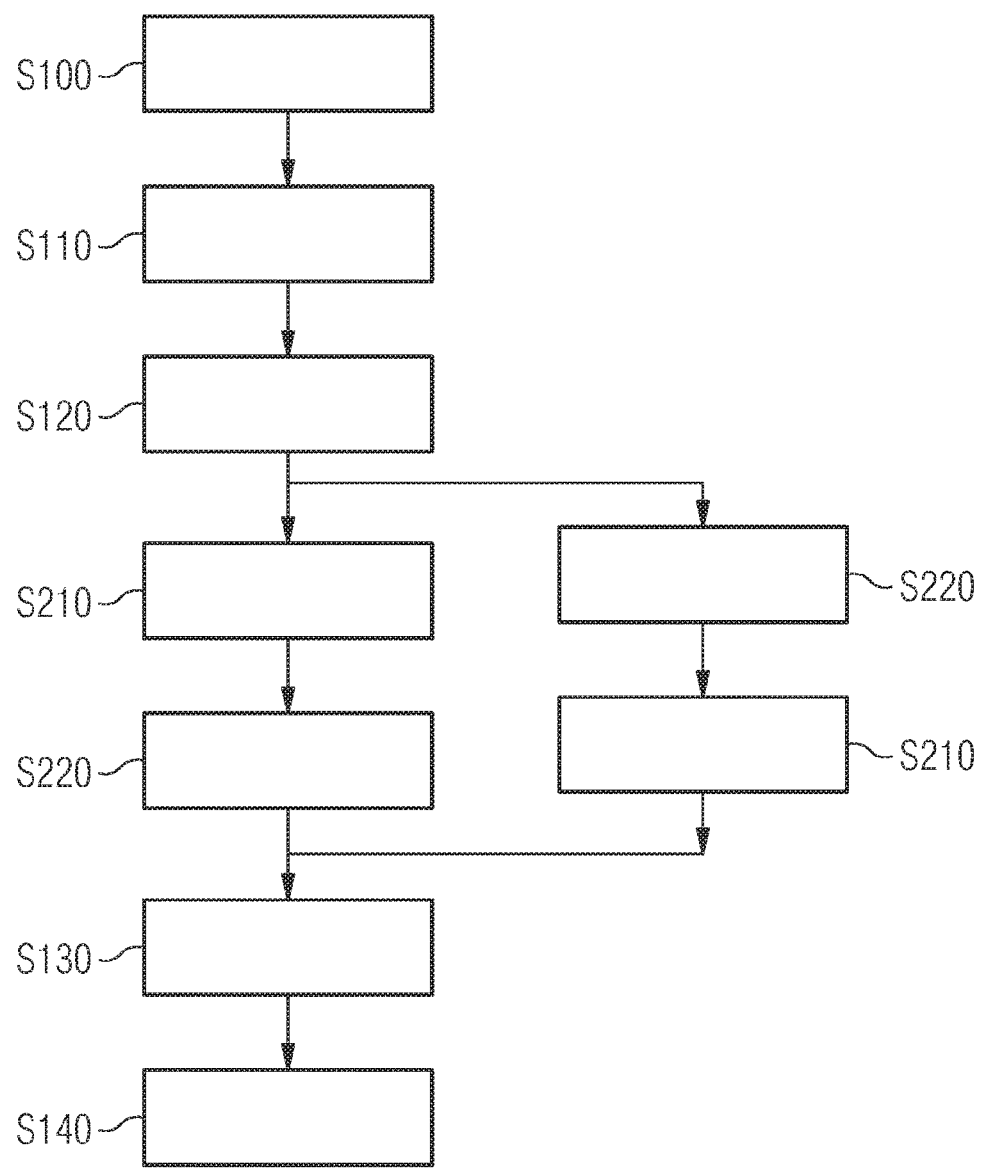

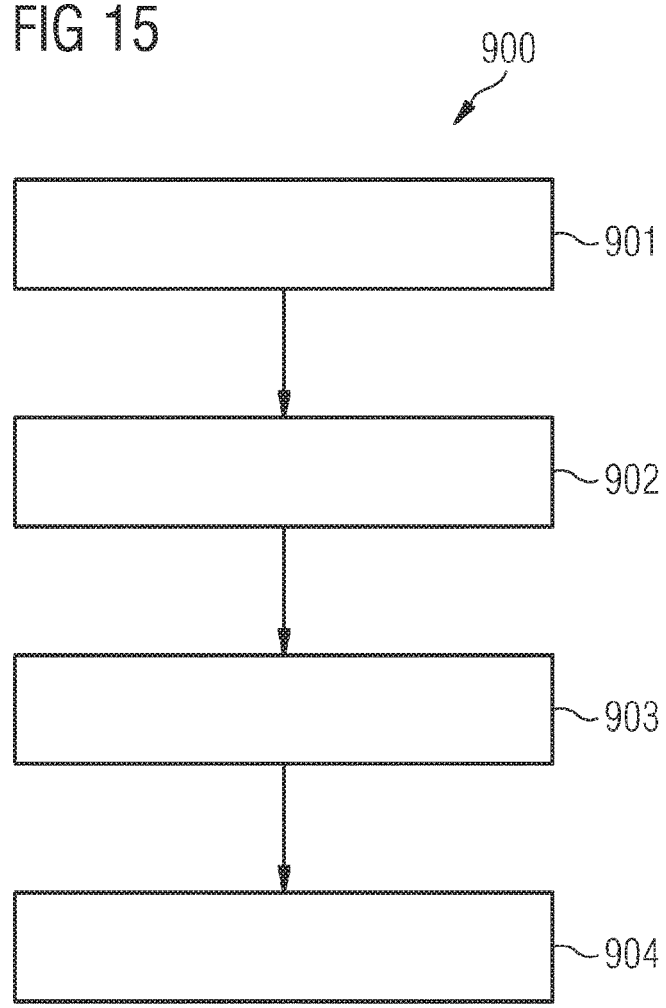

COMPOSITE WAFER, SEMICONDUCTOR DEVICE AND ELECTRONIC COMPONENT

BACKGROUND

In order to manufacture a single semiconductor device, such as a transistor, a photonic or other device, a semiconductor wafer may be processed to form a plurality of semiconductor devices at component positions in the wafers. Depending on the structure of the semiconductor devices, a plurality of functional layers may be formed on the wafer. The semiconductor wafer may include device regions which include the region of semiconductor material in which the functional units of the device are arranged and a non-device region, also known as a saw street or kerf. The non-device regions may surround each device region and delineate the component positions. Typically, the device regions are formed in a regular array of rows and columns so that the non-device regions have the form of an orthogonal grid. After forming the relevant components of the device, the wafer is separated into single chips or dies, for example by dicing the wafer, for example by sawing. The chips or dies may be separated from the wafer by cutting through the thickness of the wafer along the non-device regions.

SUMMARY

In an embodiment, a composite semiconductor substrate includes a first polymer layer and one or more semiconductor dies having a first surface, a second surface opposing the first surface, side faces extending between the first surface and the second surface and a first metallization structure on the first surface. Edge regions of the first surface and at least portions of the side faces are embedded in the first polymer layer and at least one metallic region of the first metallization structure is exposed from the first polymer layer.

In an embodiment, a method includes forming at least one trench in non-device regions of a first surface of a semiconductor wafer, the non-device regions being arranged between component positions, the component positions including device regions and a first metallization structure, applying a first polymer layer to the first surface of a semiconductor wafer such that the trenches and edge regions of the component positions are covered with the first polymer layer and such that at least a portion of the first metallization structure is uncovered by the first polymer layer, removing portions of a second surface of the semiconductor wafer, the second surface opposing the first surface, revealing portions of the first polymer layer in the non-device regions and producing a worked second surface and inserting a separation line through the first polymer layer in the non-device regions to form a plurality of separate semiconductor dies.

In an embodiment, a semiconductor device includes a semiconductor die having a first surface, the first surface including a first metallization structure and edge regions surrounding the first metallization structure, a second surface opposing the first surface and including a second metallization structure, and side faces. The edge regions of the first surface and portions of the side faces are covered by a first polymer layer and edge regions of the second surface and portions of the side faces are covered by a second polymer layer, wherein the second polymer layer is in contact with the first polymer layer.

In an embodiment, an electronic component includes a semiconductor device including a semiconductor die including a first surface, the first surface including a first metallization structure and edge regions surrounding the first metallization structure, a second surface opposing the first surface and including a second metallization structure, and side faces. The edge regions of the first surface and portions of the side faces are covered by a first polymer layer, edge regions of the second surface and portions of the side faces are covered by a second polymer layer, wherein the second polymer layer is in contact with the first polymer layer. The electronic component further includes a plurality of leads, wherein the first metallization structure is coupled to a first lead and the second metallization structure is coupled to a second lead of the plurality of leads, and a plastic housing composition, wherein the plastic housing composition covers the first polymer layer and the second polymer layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1A to 1F illustrate a method of fabricating a semiconductor device according to an embodiment.

FIGS. 2A to 2F illustrate a method of fabricating a semiconductor device according to an embodiment.

FIGS. 3A to 3F illustrate a method of fabricating a semiconductor device according to an embodiment.

FIG. 6B illustrates a cross-sectional view of a wafer according to an embodiment.

FIG. 7 illustrates an arrangement for eletrodepositing a conductive layer onto a semiconductor wafer.

FIG. 8 illustrates a flowchart of a method of processing a semiconductor wafer according to an embodiment.

FIG. 14 illustrates a method for processing a semiconductor wafer according to one or more embodiments.

FIG. 15 illustrates a flow diagram of a method for manufacturing a semiconductor device.

DETAILED DESCRIPTION

Figure 4A:
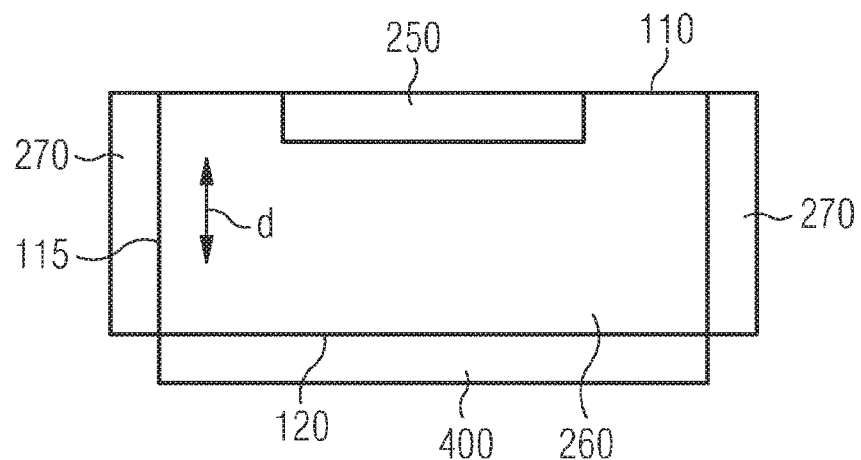
FIG. 4A illustrates a cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

DETAILED DESCRIPTION

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body, for example a major surface. This can be for instance the surface of a wafer or a die.

The term "vertical" as used in this specification intends to describe an orientation which is arranged perpendicular to the first surface, for example the major surface, of the semiconductor substrate or semiconductor body.

FIGS. 1A to 1F illustrate a method of manufacturing a semiconductor device. FIG. 1A illustrates a semiconductor wafer or semiconductor substrate 100 having a first main surface 110 and a second main surface 120 that opposes the first main surface 110. Components of semiconductor devices 250 have been processed in the first main surface 110 of the semiconductor wafer. The semiconductor devices 250 may have been formed on or in the first main surface 110 of the semiconductor wafer 100. For example, processing and etching processes may have been performed so as to manufacture the structure of single devices 250 in the semiconductor material of the chip areas, or device areas 170 and further layers, e.g. insulating layers and/or passivation layers may be deposited onto the first main surface. A metallization structure may have been formed on the first main surface 110 in the device areas 170. The chip areas 170 are laterally spaced apart from the nearest neighbour by a certain distance which corresponds to the non-device region or kerf 175. The non-device regions have a width and in plan view may form an orthogonal grid of striped regions bounding a square or rectangular device region.

Separation trenches 210 are formed in the first main surface 110, in particular in the non-device regions 175. For example, the separation trenches 210 may be formed by sawing, e.g. using a diamond saw, or by laser sawing. However, the separation trenches 210 may be also formed by any other suitable method, e.g. etching.

The separation trenches may be formed so that a bottom side or base 210a of the separation trenches 210 is disposed in and formed by the semiconductor substrate 100. The separation trenches 210 extend to a predetermined depth in the semiconductor substrate 100 and do not extend throughout the entire thickness of the semiconductor substrate 100 from the first main surface 110 to the second main surface 120. The depth of the separation trenches 210 may be selected so as to be larger than the target thickness of the semiconductor devices that are to be formed from the semiconductor substrate 100 after performing a later thinning process. The separation trenches may have a width of around 10 μm to 60 μm and a depth of around 30 μm to 70 μm. The device regions 170 are partially separated from the wafer 110 and form protruding regions bounded by a grid of orthogonal trenches 210.

In some embodiments, a sacrificial material 220 is inserted into the separation trenches 210 and may fill the separation trenches 210. For example, the sacrificial material 220 may be a glue or adhesive. The sacrificial material 220 may be deposited by a spin-coating or printing process and may form a continuous layer throughout the lateral extent of the first main surface 110 including the planar surface of the device regions 170 and may fill the trenches 210. In embodiments, in which the sacrificial material is an adhesive, the semiconductor wafer 100 may be attached to a suitable carrier 300, e.g. a glass carrier by means of the continuous layer of sacrificial material 220. The first main surface 110 is disposed on and covered by the carrier 300, as is illustrated in FIG. 1B and the sacrificial material 220 is in continuous contact with the carrier 300.

Thereafter, a thinning process may be performed so as to remove substrate material from the second main surface 120 of the semiconductor substrate 100 and reduce the thickness of the semiconductor substrate 100. For example, substrate material may be removed from the second main surface 120 using a mechanical method, such as grinding, or a chemical method, such as etching or a combination of these methods. In some embodiments, the semiconductor substrate 100 may be thinned by mechanical grinding, followed by a CMP (Chemical Mechanical Polishing) process so as to remove defects which may be caused by the grinding, or by mechanical grinding followed by wet etching or plasma etching. In some embodiments, the starting thickness of the semiconductor substrate may be around 750 µm to 800 µm. The thinning process may be performed to thin the semiconductor substrate 100 to a predetermined thickness which may be less than 100 µm, e.g. 10 µm to 50 µm.

The thinning process may be carried out until sufficient material is removed that the sacrificial material 220 positioned in the trenches 210 is uncovered and forms part of the worked second main surface of the thinned semiconductor substrate. The bottom side 210a of the separation trenches 210 formed by the semiconductor material is removed. As is illustrated in FIG. 1C, each of the single chips 260 is embedded in a matrix of the sacrificial material 220. The sacrificial material 220 is disposed between adjacent chips 260 and extends from the first main surface 110 to the worked second main surface 120 and forms a continuous layer between the semiconductor device 250 and the carrier 300. The single chips 260 are mechanically separated but bound by the sacrificial material. The assembly of single chips 260 and matrix provided by the sacrificial material 220 may be considered to be a composite wafer.

In some embodiments, the sacrificial material 220 is removed by processing from the second main surface 120 of the semiconductor substrate 100. In some embodiments, recesses 265 may be formed in the sacrificial material 220 that is disposed between adjacent chips 260. For example, the recesses 265 may be formed by plasma etching in an $O_2$ plasma. FIG. 1D shows an example of a resulting structure in which the sacrificial material 220 has been partially removed from the side faces of the single chips 260 in regions adjacent the worked second main surface 120. Portions of the side faces of the single chips 260 adjacent the first main surface remain coupled by the remainder of the sacrificial material 220.

In some embodiments, such as that illustrated in FIG. 1E, a metallization layer 400 may be formed over the resulting surface so that the metallization layer 140 covers the second side of the semiconductor chips 260, uncovered side faces of the semiconductor chips 260 and the remaining sacrificial material 220 arranged between the semiconductor chips 260. For example, the metallization layer may be deposited using a sputtering method or a metal evaporation method. For example, the metallization layer may include a metal such as Al, Ti, Ag, Cu, or Ni. The metallization layer may have a thickness of approximately 100 nm-10 µm. The assembly including the chips 260 fixed together by the sacrificial material 220 may be referred to as a composite wafer.

The single chips 260 may be separated or singulated from the composite wafer to form separate devices. In some embodiments, a carrier 510 is applied to the assembly of chips 260 fixed together by the sacrificial material 220, in particular to the second main surface. The separating carrier 510 may be a foil, e.g. a sawing foil which may be carried by a suitable frame 500. The assembly of chips 260 may be mounted on the separating carrier 510 so that the metallization layer 400 is adjacent to and in contact with the separating carrier 510 and the carrier 300 is removed to expose the sacrificial material 220 on the first main surface 110. The sacrificial material 220 may be removed to separate the single chips 260.

As is shown in FIG. 1F, the sacrificial material may be removed by processing or working the first main surface 110 of the semiconductor substrate 100.

When removing the sacrificial material 220, the sacrificial material 220 present in the separation trenches 210 between adjacent chips 260 including a portion of the metallization layer formed on the sacrificial material that extends between neighbouring chips 260 in the recess 265 is removed. As a result, the single chips 260 are separated from the assembly or composite wafer, as is illustrated in FIG. 1F, and may be arranged spaced apart from one another on the carrier 510.

In some embodiments, such as that illustrated in FIG. 1F, the single chips 260 include a metallization structure that extends from the rear surface onto a least portions of the side faces. This arrangement may be used to control bleed out during soldering of the rear surface onto a substrate, for example a die pad. The portion of the metallization structure on the side faces may encourage the formation of a meniscus of molten solder and limit the lateral extent of the flow of solder. This may assist in improving the reliability of the solder joint and/or the yield of reliable solder joints.

FIGS. 2A to 2F illustrate cross-sectional views of a semiconductor substrate 100 during a method according to a further embodiment. The semiconductor substrate 100 illustrated in FIG. 2A is similar to the semiconductor substrate 100 shown in FIG. 1A. Further, the steps shown in FIGS. 2B and 2C are similar to the steps described with reference to FIGS. 1B and 1C, respectively. For example, the thickness of the semiconductor substrate 100 after removing the substrate material may be 10 µm to 40 µm. In contrast to the embodiment illustrated in FIGS. 1A to 1F, in some embodiments, such as that illustrated in FIG. 2D, the sacrificial material 220 is not recessed or partially removed from the second side after the thinning process is performed. In this embodiment, the second main surface 120 is planar and includes areas of the semiconductor chips 260 bounded by the sacrificial material 220.

In some embodiments, a metallization layer is formed on the second main surface 120 of the semiconductor wafer and therefore on the second surface of the semiconductor chips and sacrificial material 220 to form a planar continuous layer. The metallization layer may include a metal seed layer 410 and a thick metallization layer 420 formed on the seed layer 410. For example, the seed layer may include titanium or a titanium compound layer having a thickness of approximately 50 nm to 200 nm. The seed layer may further include a thin copper layer, e.g. having a thickness of 50 nm to 400 nm formed over the titanium or titanium compound layer. By way of example, the seed layer(s) may be formed by sputtering. The thick metallization layer 420 may include or be a copper or a copper compound layer. For example, the copper layer may be formed by a galvanic method. The copper layer may have a thickness of approximately 10 µm to 30 µm. FIG. 2D shows an example of a resulting structure.

A photolithographic method may then be performed so as to form grooves 430 in the thick metallization layer 420. The grooves 430 may be arranged above the sacrificial material 220 and therefore in the non-device regions or saw streets. FIG. 2E shows an example of a resulting structure. According to an embodiment, the seed layer may be etched by this processing step to form separate conductive areas on the device regions that are separated and spaced apart by the sacrificial material 220. According to a further embodiment, a portion of the seed layer, e.g. the titanium or titanium compound layer may remain in the non-device regions.

The assembly of chips 260 embedded in the sacrificial material 220 and including the metallization layer 420 and optionally the seed layer is mounted to a suitable separating carrier 510. The separating carrier 510 may have the form of a foil as in the embodiment described in connection with FIG. 1F. The carrier 300 is removed from the first main surface 110 and the sacrificial material 220 is removed so as to separate the single chips 260 from another, whilst the chips 260 remain attached to the carrier 510. The sacrificial layer 220 may be removed from the first main surface 110 of the semiconductor substrate 100. The sacrificial layer 220 may be removed entirely from the side faces. In embodiments including a seed layer, the portion of the seed layer arranged on the sacrificial layer 220 that extends between neighbouring chips 160 may be removed or diced by this process. The thick metallization layer 420 may be a so-called power metallization layer which may be used so as to conduct large currents.

FIGS. 3A to 3F illustrate a method according to an embodiment. A semiconductor substrate 100 may be processed as described above with reference to FIG. 1A to introduce trenches 210 into first main surface of the semiconductor substrate 100, in particularly, into the non-device areas so as to partially separate the chips 260 from the wafer 100. In this embodiment, an insulating material 270 is inserted into the separation trenches 210. The insulating material 270 may be an insulating polymer, such as an epoxy resin, or a ceramic material, such as a ceramic material including a silicon oxide or a silicon nitride. The insulating layer 270 may be inserted in the separation trenches 210 using a printing process. Then, an adhesive layer 280 is formed over the first main surface 110 of the semiconductor substrate 100 which covers both the insulating material 270 and first main surface of the partially separated chips 260 continuously. A carrier 300, e.g. a glass carrier, is mounted on the adhesive layer 280. As a result, as is illustrated in FIG. 3B, the semiconductor wafer 100 is mounted on the carrier 300 so that the first main surface 110 is disposed on a side adjacent to the carrier 300 and is covered by the carrier 300.

In a similar manner as has been described above with reference to FIGS. 1C and 2C, the semiconductor substrate 100 is thinned from the opposing side of the wafer, i.e. material is removed from the second main surface 120. The thinning process is performed until the target thickness of the semiconductor substrate 100 is reached and/or the insulating material 270 arranged in the trenches 210 is uncovered so that the chips 260 are no longer mechanically attached to one another by semiconductor material. In particular, a mechanical force is no longer transferred from one chip to the next by means of the semiconductor material. Consequently, a crack is prevented from propagating from one chip to another. In the event that a crack is formed in a chip 260 during the separation of the chips, it cannot propagate to further chips through a common semiconductor material so that damage to further chips can be avoided and the yield increased. The insulating material 270 is disposed between adjacent chips 260, and an adhesive layer 280 is disposed between the chips and the carrier 300. The single chips 260 are coupled by the insulating material 270 to form a composite wafer.

A metallization layer 410, 420 may be formed over the second main surface 120 which covers the second surface of the semiconductor chips 260 and the insulating material 270. This may be performed in the manner as has been described above with reference to FIG. 1E or 2D. When the metallization layer is formed in the manner as has been described above with reference to FIG. 2D, a photolithographic process including an an etching process may be performed so as to separate the metallization layer into portions arranged on the device areas of the single chips 260. The seed layer 410 may be etched and removed in the non-device regions or maintained. FIG. 3D shows an example of a resulting structure.

The assembly of chips 260, in particular the metallization layer 410, 420, is mounted on a separating carrier 510 to separate the single devices from the composite wafer, as described above. The single semiconductor chips 260 are separated from each other and from the assembly or composite wafer, for example using a laser sawing or dicing process, by removing at least a portion of the insulating material 270 to form a gap from the first surface to the second surface. If laser sawing is used, a laser beam may be directed at the first main surface at the insulating material 270 arranged between adjacent chips 260. If a portion of the seed layer 410 still is present between adjacent chips 260, this portion may be diced or cut by the singulation or separating process. As is illustrated in FIG. 3F, adjacent chips may be separated at a boundary line 435 so that a portion of the insulating material 270 remains on a side wall of each of the chips 260.

In the embodiment described with reference to FIGS. 3A to 3F, the sacrificial material 270 may be implemented by an insulating material so that the side walls of the semiconductor chip 260 are provided with insulation by the portion of the insulating material 270 remaining on the side wall or side faces of the chip 260.

Figure 4B:
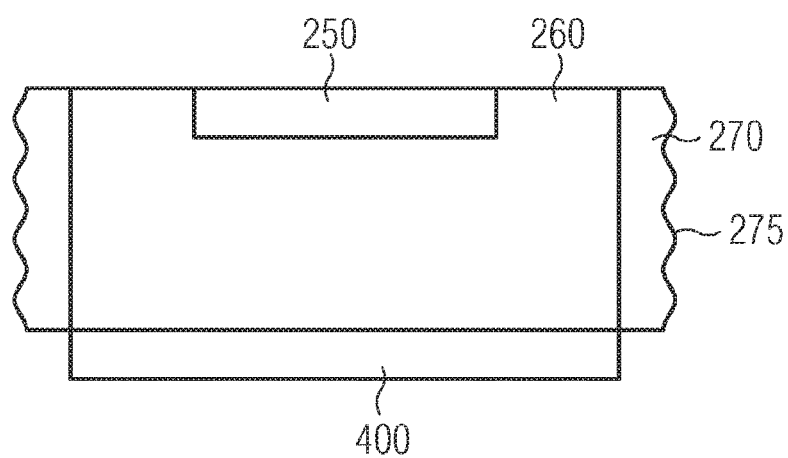
FIG. 4B illustrates a cross-sectional view of a semiconductor device according to an embodiment.

FIGS. 4A and 4B show cross-sectional views of semiconductor chips 260. In FIG. 4A, functional devices or components of a semiconductor device 250, for example a transistor such as a MOSFET, are formed in the semiconductor chip 260 and a metallization structure including contact pads may be formed on the first main surface in the device regions. A backside metallization layer 400 is formed on a second main surface 120 of the semiconductor chip 260. An insulating layer 270 is formed on a side wall 115 of the semiconductor chip 260. For example, the insulating material 270 may be an insulating polymer, e.g. an insulating carbon compound. Specific examples include an epoxy resin, a plastic material, or a ceramic material, e.g. including silicon oxide or silicon nitride. The insulating material may have a thickness of approximately 5 µm to 20 µm. The insulating material is integrally formed to cover the side wall of the semiconductor chip 260. The semiconductor chip 260 may have a thickness d of 5 µm to 100 µm, e.g. 5 µm to 20 µm.

FIG. 4B shows a cross-sectional view of a semiconductor chip 260 according to an embodiment. The insulating layer 270 may be cut with a laser and a cut surface 275 of the insulating layer 270 may be rough, in particular may have a greater surface roughness that the upper uncut surface of the insulating layer 270. A portion of the insulating layer 270 may be burned so as to form a rough surface 275 due to the laser dicing process.

Figure 5:
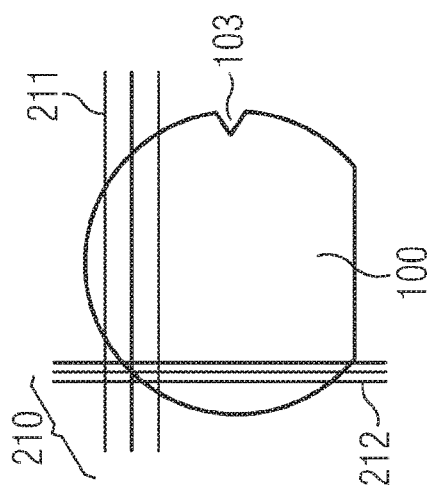
FIG. 5 illustrates a plan view of a semiconductor wafer.

FIG. 5 shows a schematic view of a wafer 100 including a notch 103 for aligning the wafer in a wafer processing or wafer handling system in a pre-determined orientation. FIG. 5 further shows a plurality of separation trenches 210. As is shown, the separation trenches include first separation trenches 211 which extend in a first direction, and second separation trenches 212 which extend in a second direction perpendicular to the first direction.

According to the embodiments described above with reference to FIGS. 1A to 3F, the semiconductor wafer 100 is thinned substantially uniformly over the second main surface 120 to form a substantially planar surface. According to a further embodiment, this thinning process may be carried out so that more substrate material is removed from a central portion 116 of the semiconductor wafer than from an edge portion 117 of the semiconductor wafer, i.e. a recess in a central portion of the second main surface may be formed. A ring protruding from the second main surface may be formed at the periphery of the recess which may be used to provide stability for the semiconductor wafer during subsequent processing and handling. The ring may be continuous.

The removing substrate material from the second main surface 120 of the semiconductor substrate 100 may include a first process of removing substrate material from the entire second main surface, and a second process of removing substrate material from a central portion of the semiconductor substrate to form a recess while maintaining an edge portion of the semiconductor substrate.

The first thinning process may be performed so as to reduce the thickness of the wafer to 50 to 100 µm. The first thinning process may include etching and may remove substrate material from the central portion of the semiconductor substrate and from the edge portion to produce a substantially planar worked surface. A second thinning may be performed which only thins the central portion 116 of the semiconductor wafer 100, whereas the edge portion 117 is not thinned during the second thinning process.

Figure 6A:
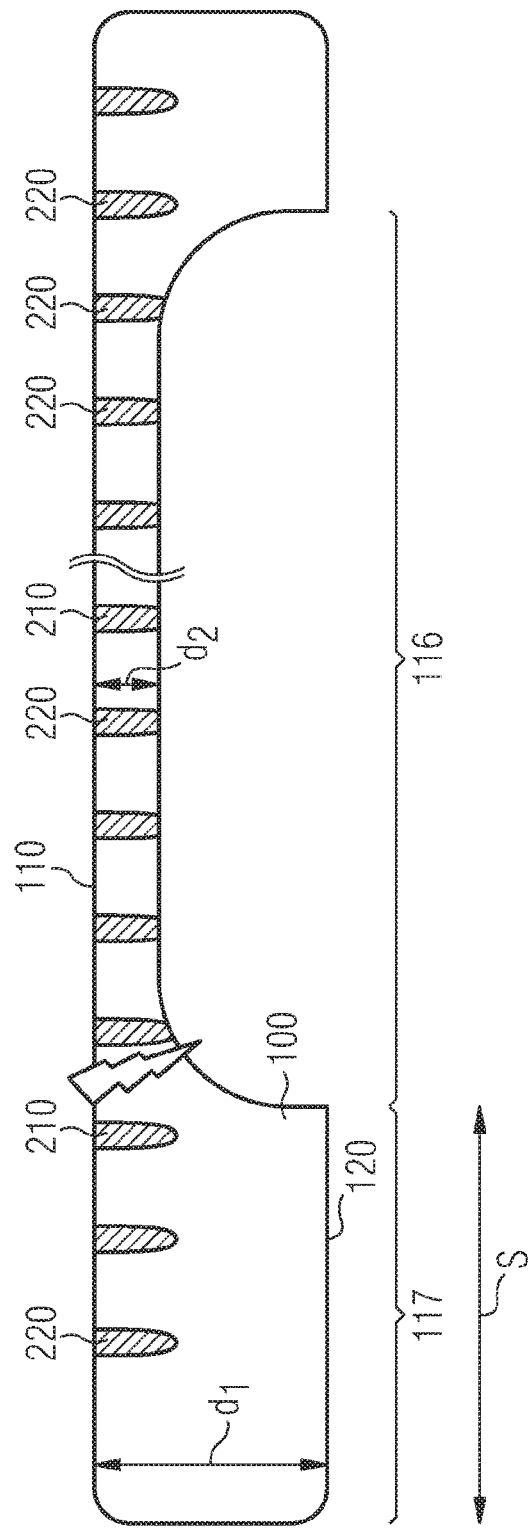
FIG. 6A illustrates a cross-sectional view of a wafer according to an embodiment.

FIG. 6A shows an example of a semiconductor wafer 100 including a central portion 116 and an edge portion 117. As a result of performing the first and the second thinning process as explained above, a thickness d1 of the edge portion 117 is larger than a thickness d2 of the central portion 116. For example, a thickness d1 of the edge portion 117 may be 30 µm to 150 µm after performing the thinning process. A thickness d2 of the central portion 116 may be 5 µm to 100 µm after performing the second thinning process. A ratio of thicknesses d1 to d2 may be approximately 2 to 5. A width s of the edge portion 117 may be 0.5 to 5 mm.

Before performing the thinning process(es), a plurality of separation trenches 210 are formed in the first main surface 110 of the semiconductor wafer opposing the second main surface of the semiconductor substrate 100 in both the central region 116 and in the protruding edge portion 117 and sacrificial material or insulating material Is inserted into the trenches 210. Each of the trenches 210 has substantially the same depth so that, after the second main surface has been worked to remove material and to form the recessed central region 116, the sacrificial material 220 is uncovered and extends throughout the remaining thickness of the central portion 116. In the edge regions 117, however, the trenches 220 have a base that is formed by the material of the semiconductor wafer since the depth d1 is greater than the depth of the trenches 210. A curved interface is formed between the recessed central portion 116 and the edge portion 117 due to the shape of the grinding tool and grinding motion used to form the central portion 116. This interface may provide a pre-determined breaking point, as its indicated by the arrow in FIGS. 6a and 6b, which may assist in the removal of the edge portion 117. The edge portion 117 may not include device regions.

After performing the first and the second thinning process as has been described above, the wafer may be further processed in the manner as has been described above with reference to FIG. 1D to 1F, 2D to 2F or 3D to 3F to form a metallization on the second main surface and to partially or entirely remove the sacrificial material 220 to separate the semiconductor chips or dies from the semiconductor substrate 100.

Due to the presence of the thicker edge portion 117, the chips 260 at the edge region of the wafer may be prevented from flying away when subjected to mechanical force during separation or singulation. When the wafer is mounted on the separating carrier 510 as is shown in FIGS. 1F, 2F and 3F, for example, the single chips may be separated from each other by removing the foil, for example by peeling or tearing off the foil. The separation trenches 210 are formed in the edge portion 117 and extend in the first and the second direction and are positioned at the boundary of each chip or component position. Upon removal of the foil 510, the edge portion 117 is separated from the remainder and the chips may be separated from each other.

FIG. 6B illustrates a cross-sectional view of a portion of the semiconductor substrate 100 according to an embodiment. In addition to the components shown in FIG. 6A, a metallization layer 400 is formed on the second main surface 120 of the semiconductor substrate 100. In some embodiments, the metallization layer 400 is formed in the central portion 116 of the semiconductor substrate 100 and is absent from the edge portion 117.

In some embodiments, the metallization layer 400 may be selectively formed in the central portion 116, for example, by using a shadow mask. The metallization layer 400 may be formed by a deposition method such as a chemical vapour deposition method, by a thermal vapour deposition method or by a sputtering method. In some embodiments, the metallization layer 400 may be formed by depositing a continuous layer over the central portion 116 and edge portion 117 and by removing, for example by etching, the metallization layer 400 from the edge portion 117.

In some embodiments, the metallization layer 400 may be selectively deposited into the central portion of the second main surface 120 of the semiconductor substrate 100 using a galvanic process, as will be described below with reference to FIG. 7.

FIG. 7 illustrates a cross-sectional view of a semiconductor wafer 100 and a chuck 720 that supports a carrier 300 in contact with and supporting the first main surface of the semiconductor substrate 100. A metallization layer such as copper may be deposited using a galvanic process onto the second main surface. The metallization layer 400 may include a seed layer 410 and a thick metallization layer 420 which is built up on the seed layer 410. The seed layer 410 may be deposited using a physical vapour deposition process such as sputtering onto the entire second main surface such that it forms a continuous layer over the edge portion 117, central portion 116 and interface between the recessed central portion 116 and the protruding edge portion 117.

FIG. 7 shows a member 700 having an arm 730 with protrusions 731 which are in contact with the seed layer 410 arranged on the edge portion 117 and a larger head 732 which extends into the recess and is in contact with the seed layer 410 in a peripheral region of the central portion 116 adjacent the interface. The member 700 may act to seal a portion of the central portion 116 so that the thick metallization layer 420 is selectively formed in the central portion 116. The member 700 is metallic and together with the seed layer 410 may act as an electrode in the electrodeposition of the thicker metallization layer 420 in the central portion 116 in regions uncovered by, and central to, the head 732.

The thick metallization layer 420 has a thickness d3 and reduces a height difference between the outer surface of the edge portion 117 and the outer surface of the metallization layer 420. A reduced height difference may assist in simplifying handling of the semiconductor wafer. In particular, wafer bowing may be avoided, for example when the semiconductor wafer is mounted to the separating foil 510. In the example shown in FIG. 7, a thickness d1 of the semiconductor substrate in the edge portion 117 may be approximately 50 µm, a thickness d2 of the semiconductor substrate 100 in the central portion 116 may be approximately 20 µm. A thickness of the thick metallization layer 420 may be 10 to 15 µm. A width s of the edge portion 117 may be 1.5 mm.

FIG. 8 illustrates a flow diagram of a method of manufacturing a semiconductor device according to embodiment. The method includes forming a plurality of separation trenches in a first main surface of a semiconductor substrate, a bottom side of the separation trenches being disposed in the semiconductor substrate such that the base of the trench is formed by material of the semiconductor substrate (S100). The method further includes inserting a sacrificial material in the separation trenches (S110), removing substrate material from a second main surface of the semiconductor wafer to uncover a bottom side of the separation trenches and sacrificial material (S120), mounting the semiconductor substrate onto a separating carrier so that a second main surface of the semiconductor substrate is disposed on a side of the separating carrier (S130), and thereafter, separating the semiconductor substrate into a plurality of semiconductor chips (S140).

In an embodiment, the removing substrate material from the second main surface of the semiconductor substrate (S120) may include a first process of removing substrate material from the entire second main surface (S125), and a second process (S127) of removing substrate material from a central portion of the semiconductor substrate to from a recess while maintaining an edge portion of the semiconductor substrate which bounds the recess.

Figure 9:
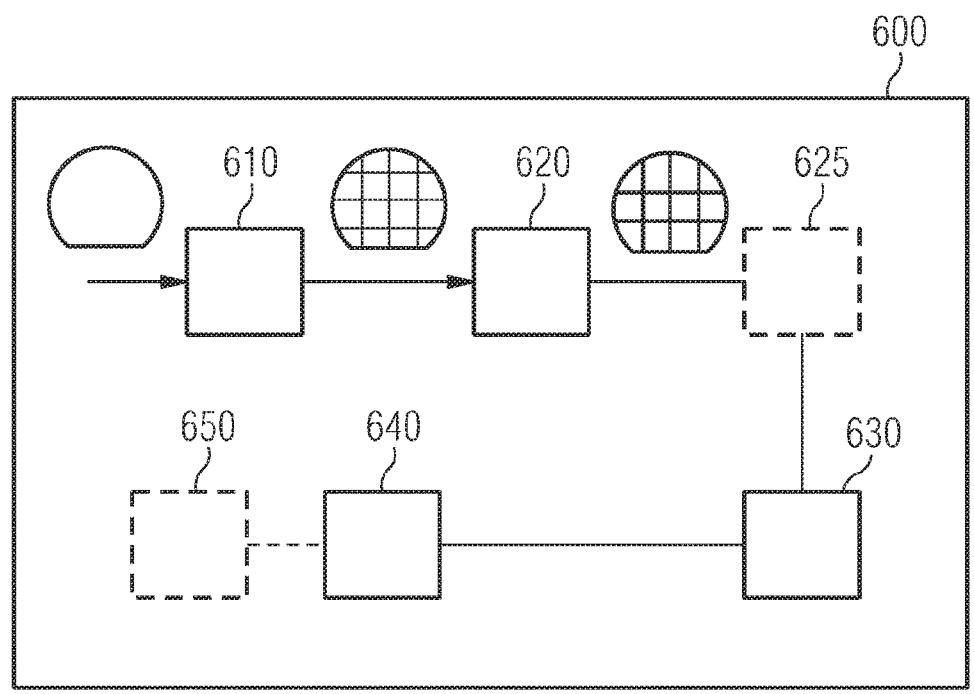
FIG. 9 illustrates apparatus for processing a semiconductor wafer.

FIG. 9 schematically illustrates apparatus 600 for processing a semiconductor wafer 100. The apparatus 600 includes a unit 610 configured to a form a plurality of separation trenches in the first main surface of the semiconductor substrate, a bottom side of the separation trenches being disposed in the semiconductor substrate. For example, the unit 610 may include a saw, e.g. a diamond or similar saw, a laser saw or a etching device which may etch separation trenches at a high precision so that a predetermined depth of the separation trenches is achieved.

The apparatus 600 may further includes a unit 620 configured to insert a sacrificial material in the separation trenches. For example, this unit 620 may be any kind of a printing or spin coating device. Optionally, the apparatus 600 may further include a unit 625 that is configured to mount the semiconductor wafer on a carrier, e.g. a glass carrier so that the first main surface is disposed on a side adjacent to the carrier. The apparatus may include a unit 630 configured to remove substrate material from a second main surface of the semiconductor substrate so as to uncover the bottom side of the separation trenches. For example, this unit 630 may include a grinding device, a polishing unit, an etching unit, a CMP unit and others. The apparatus 600 may further include a unit 640 configured to mount the assembly of the semiconductor chips fixed together by the sacrificial material on a separating carrier so that the second main surface is disposed on a side adjacent to the carrier. The unit 640 may transfer the assembly of semiconductor chips whilst the separating trenches are filled with the sacrificial material. The unit 640 may be a handling unit which laminates the assembly of chips on the carrier.

The apparatus 600 may be a cluster tool in which the several units may be housed. For example, the wafer may be transferred between the different units without being exposed to ambient air. The apparatus 600 may also be provided in the form of a production line with each unit being provided by separate apparatus.

The apparatus 600 may further include a unit 650 configured to form a metal layer over the second main surface after removing the substrate material from the second main surface. The 650 may be a galvanic unit or a chemical vapor deposition device, a physical vapour deposition device, a sputtering device or any other suitable device for forming a metal layer.

The unit 630 that is configured to remove a substrate material from a second main surface of the semiconductor wafer to uncover the bottom side of the separation trenches may be configured to perform a first removing step for removing substrate material from the entire second main surface and to perform a second process for removing substrate material only from a central portion of the semiconductor wafer.

Figure 10A:
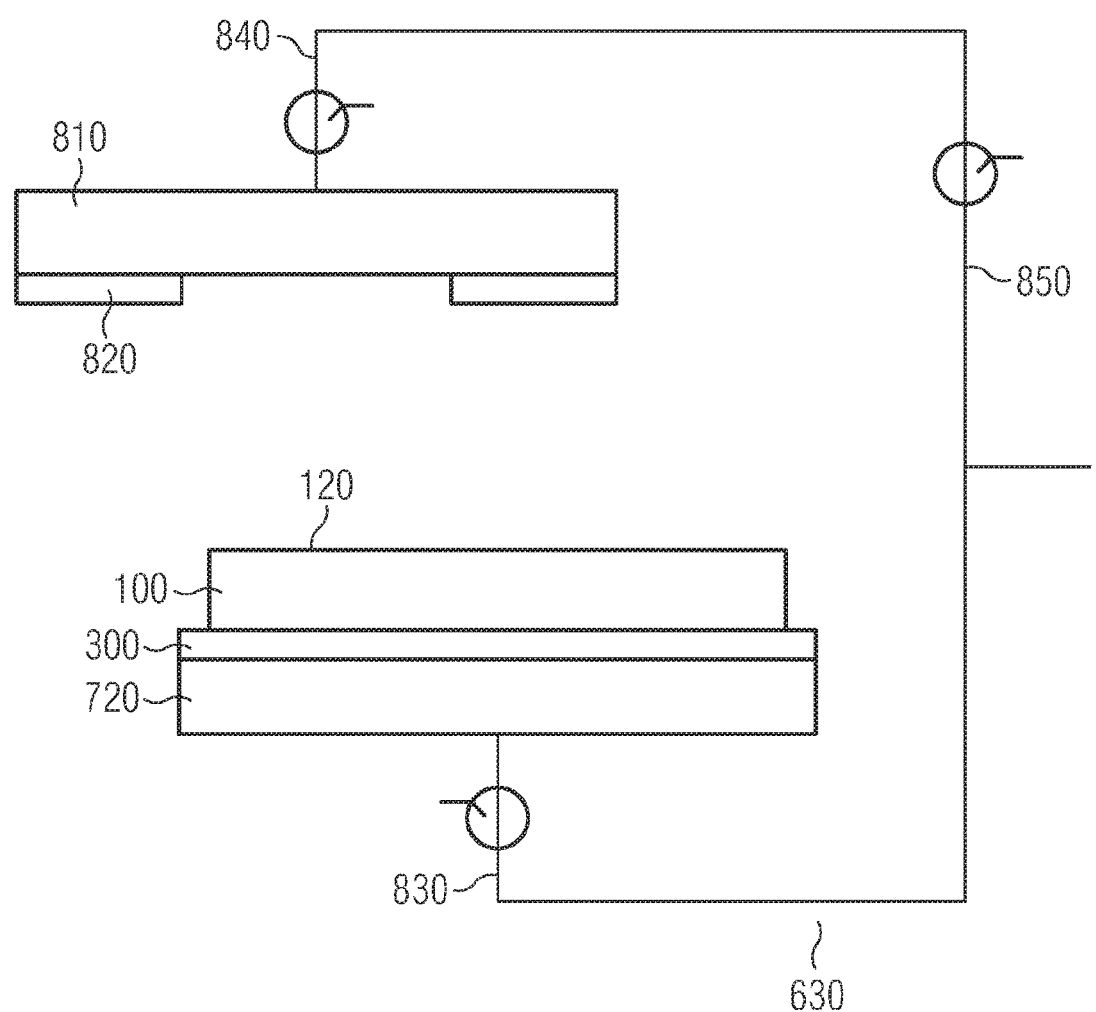
FIG. 10A illustrates apparatus for processing a semiconductor wafer.

FIG. 10A illustrates the unit 630 which, in this embodiment, may a grinding device. The unit 630 may include a chuck 720 that may be fixed to a first shaft 830 that may rotate the chuck 720 in a first rotational direction, e.g. clockwise. A carrier 300 supporting the semiconductor substrate 100 may be mounted to the chuck 720. The second main surface 120 of the semiconductor substrate 100 is uncovered. The unit 630 further includes an element 850 carrying a second shaft 840 that may rotate a first grinding wheel 810 in a second rotational direction, e.g. counterclockwise. The first grinding wheel 810 may have a diameter that approximately corresponds to a diameter of the semiconductor substrate. The grinding wheel 810 includes a grinding portion 820 that is arranged at an edge portion of the grinding wheel along the circumference of the grinding wheel 810. The grinding portion 820 includes abrasive grains such as made of diamond that grind and mechanically remove the substrate material from the second main surface 120. When performing a grinding process, the chuck 720 supporting the carrier 300 and the semiconductor substrate 100 is rotated in a first rotational direction, and the first grinding wheel 810 is rotated in a second rotational direction. At the same time, the element 850 is moved so that the first grinding wheel 810 is brought into contact with the semiconductor substrate 100. Further, the first rotating grinding wheel is moved along the circumference of the semiconductor substrate 100. Thereby, the first process of removing substrate material from the entire second main surface of the semiconductor substrate may be performed.

Figure 10B:
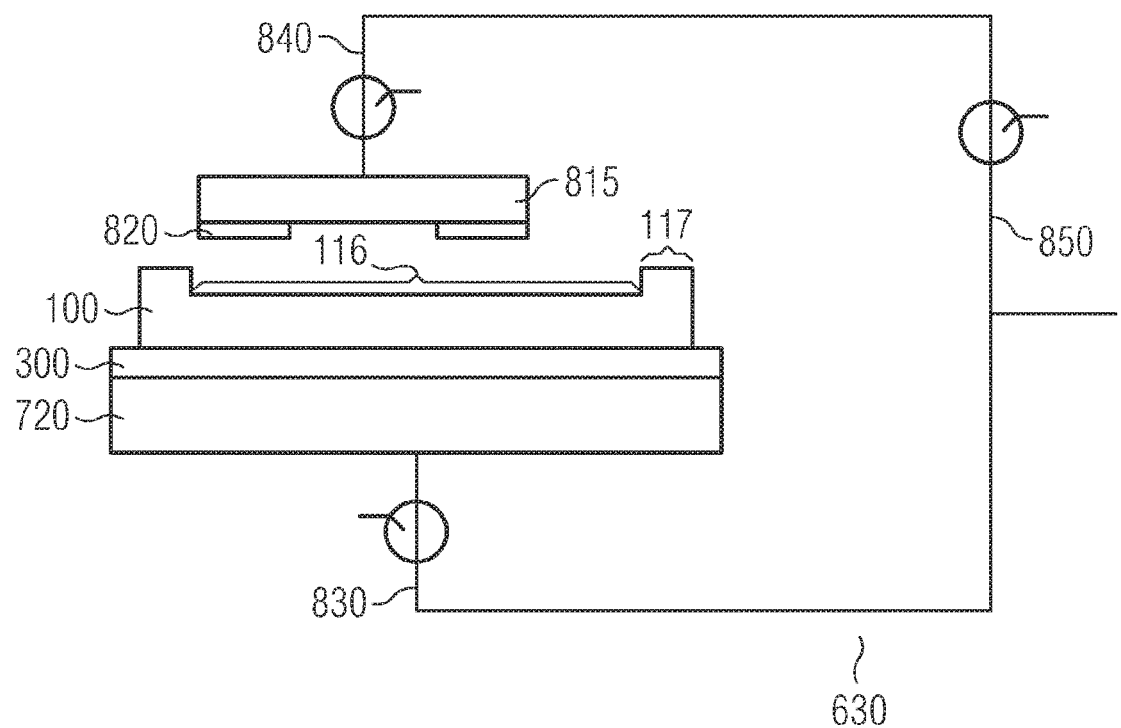
FIG. 10B illustrates apparatus for processing a semiconductor wafer.

For performing the second process of removing substrate material from a central portion of the semiconductor substrate while maintaining the edge portion of the semiconductor substrate, a smaller second grinding wheel 815 replaces the first grinding wheel 810 as is illustrated in FIG. 10b.

The second grinding wheel 815 is similar to the first grinding wheel 810 but has a smaller diameter. For example, a diameter of the second grinding wheel 815 may be approximately half of the diameter of the first grinding wheel. The chuck 720 is rotated in a first rotational direction, and the semiconductor substrate 100 is rotated in a second rotational direction opposing the first rotational direction. The element 850 is moved so that the second grinding wheel 815 is brought into contact with the semiconductor substrate 100. The second grinding wheel 815 is positioned to a central portion 116 of the semiconductor substrate 100.

Further, the second rotating grinding wheel 815 is moved along the central portion 116 of the semiconductor substrate 100 to produce a recessed central portion bounded by a circular ring-shaped edge portion having a greater thickness.

Due to the processing method described herein including forming separation trenches in a semiconductor substrate, filling a sacrificial material or insulating material into the separation trenches, thinning the semiconductor substrate and, thereafter, separating the single semiconductor chips, the semiconductor chips are fixed and protected by the sacrificial material after having been mechanically separated from the thinned semiconductor substrate. After thinning the semiconductor substrate, the semiconductor chips are mechanically separated but still bound by the adjacent sacrificial or insulating material in an assembly or composite wafer. As a result, damage due to the close spatial relationship of adjacent semiconductor chips may be prevented, and the semiconductor chips can be handled in an easy manner.

Due to the process of removing the substrate material including a first process and a second process, a stabilizing edge portion of the semiconductor substrate may be maintained so that single chips may be prevented from flying away when the supporting foil is removed from the second main surface. The thicker edge portion of the semiconductor substrate may be destroyed when separating the single chips or the thicker edge-portion may crack when the foil is expanded for the chip removal or pick-up-process. Due to the concept of forming separation trenches and filling the separation trenches with a sacrificial material, cracks and stress generated during this destruction of the edge portion will not affect the single chips.

FIGS. 11A to 11F show cross-sectional views of a portion of a semiconductor substrate when performing a method according to one or more further embodiments. According to one or more embodiments, after the thinning process in which material s removed from the second main surface 120, protruding portions of an insulating material may be formed over the second main surface 120 of the semiconductor substrate 100 so as to be positioned over the separation trenches 210.

Figure 11A:
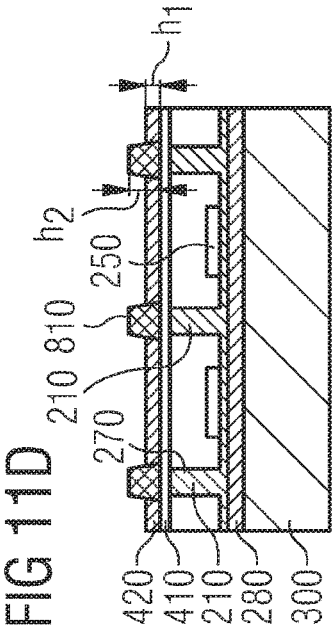
FIGS. 11A to 11F illustrate a method for processing a semiconductor wafer.

Starting point for performing the method according to one or more embodiment may be e.g. the structure shown in FIG. 2C or 3C. For example, a semiconductor substrate 100, such as a wafer may have been processed so that components of the semiconductor devices 250 are formed adjacent to a first main surface 110 of the semiconductor wafer and separation trenches 210 are formed in the semiconductor substrate 100 in the non-device regions adjacent the semiconductor devices 250. The separation trenches 210 separate adjacent device areas from each other. A sacrificial material 270 may be insulating is arranged in and may fill the separation trenches 210. The sacrificial material 270 may cover the entire surface of the first surface of the semiconductor wafer 100. The first main surface 110 may be attached to the carrier 300 by means of an additional adhesive layer 280. The adhesive layer 280 may be arranged between the first main surface 110 and the carrier 300. To a metallization layer on the second main surface 120 of the semiconductor substrate, a seed layer 410 may be deposited. For example, the seed layer may include a layer stack including one or more titanium layers and/or one or more copper layers. FIG. 11A shows an example of a resulting structure. Thereafter, protruding portions 810 of an insulating material may be formed over the second main surface 120. The protruding portions 810 may be arranged at positions of the separation trenches 210 and surround the device regions of the semiconductor chips.

Figure 11B:
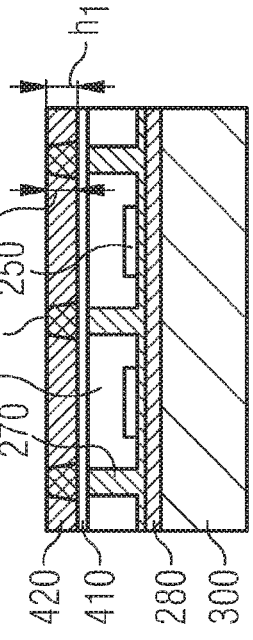

FIG. 11B shows an example of a resulting structure. As is shown, the protruding portions 810 of the insulating material are arranged at positions of the separation trenches 210. According to some embodiments, the material of the protruding portions 810 may be the same as the sacrificial material 270. For example, the material of the protruding portions 810 may be an epoxy resin. For example, the epoxy resin may be an epoxy resin that may be patterned using UV light. For example, after performing a patterning process, e.g. using UV light, a thermal treatment may be performed. For example, the protruding portions may have a height of approximately 7 to 10 µm.

Figure 11C:
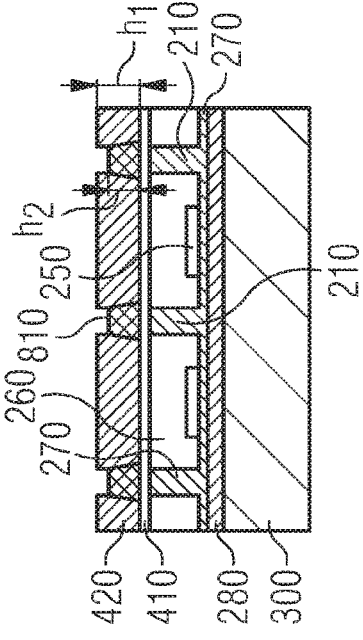
Figure 11D:
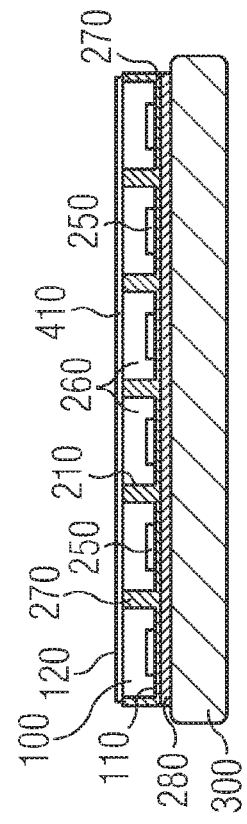

Thereafter, a metallization layer 420 may be formed over the second main surface 120 to cover the spaces between adjacent protruding portions 810. FIG. 11C shows an example of a resulting structure. According to embodiments, the metallization layer 420 may be formed so that the protruding portions 810 protrude over the metallization layer 820. For example, a height h2 of the protruding portions 810 may be larger than a height h1 of the metallization layer 420, e.g. the difference may be 2 to 3 µm. FIG. 11D shows an example of corresponding embodiments.

Figure 11E:
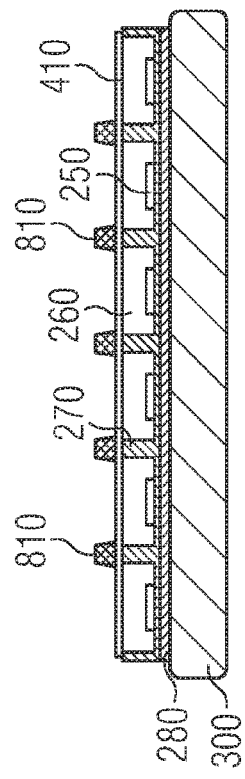

According to further embodiments, the metallization layer 420 may be flush or substantially coplanar with the protruding portions 810. For example, the height h2 of the protruding portions 810 may be approximately equal to the height h1 of the metallization layer 420. FIG. 11E shows an example of a corresponding structure.

Figure 11F:
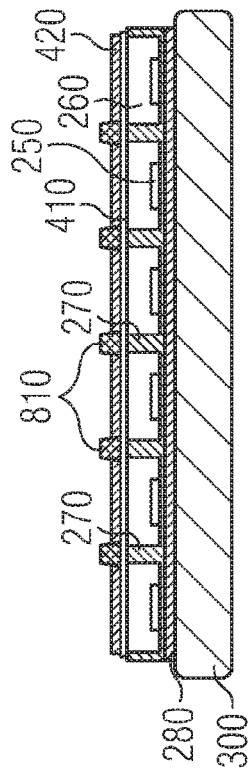

According to further embodiments, the height h1 of the metallization layer may be larger than the height h2 of the protruding portions 810. FIG. 11F shows an example of a corresponding structure. The height h2 of the protruding portions 810 in comparison to the height h1 of the metallization layer 420 may be selected in accordance with the desired functionality of the protruding portions 810. Generally, due to the presence of the protruding portions 810, the stability of the single semiconductor chips 260 may be improved. For example, the semiconductor chips 260 may be mechanically supported at the edge of the first or second main surface. Moreover, the semiconductor chips 260 may be mechanically supported at the edge of the first or second main surface. Moreover, the semiconductor chips 260 may be mechanically stabilized, in particular, during the processing steps of forming the metallization layer and isolating the single chips. This may be useful, in particular, when the substrate has been thinned to a small thickness of e.g. less than 100 µm, more specifically less than 50 µm. In addition, the sidewalls of the semiconductor chips may be protected. For example, in the arrangement illustrated in FIG. 11D, the protruding portions 810 may provide a solder stop so that when soldering the semiconductor chips, soldering material may be prevented from flowing away.

According to the embodiment shown in FIG. 11E, the back side of the semiconductor chips 260 may be planar. According to the embodiments shown in FIG. 11F, the electrical connection between soldering and the back side metallization may be improved. According to the embodiments described with reference to FIGS. 11A to 11F, the metallization layer is formed after forming the protruding portions.

Figure 12A:
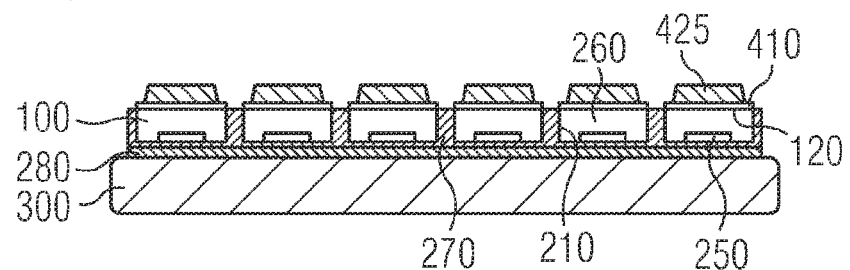
FIG. 12A illustrates a cross-sectional view of a portion of a semiconductor wafer according to one or more embodiments.

According to further embodiments, the protruding portions 810 may be formed after forming the metallization layer. For example, starting from the workpiece shown in FIG. 11A, a further metallization layer 420 may be formed over the second main surface 120 of the semiconductor substrate 100. Thereafter, the metallization layer 420 and the seed layer 410 may be patterned so that metallization pads 425 are disposed over the semiconductor chips 260. FIG. 12A shows an example of a resulting structure. As is shown, adjacent semiconductor chips 260 are separated from each other by means of the separation trenches 210 filled with a sacrificial material 270. The single metallization pads 425 are spaced apart and isolated from each other by intervening regions of the sacrificial material 270.

Figure 12B:
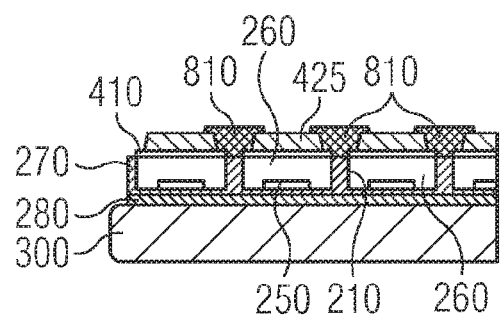
FIG. 12B illustrates a cross-sectional view of a portion of a semiconductor wafer according to one or more embodiments.
Figure 12C:
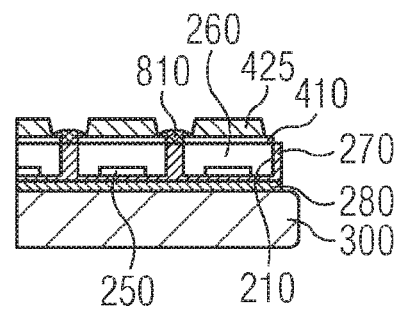
FIG. 12C illustrates a cross-sectional view of a portion of a semiconductor wafer according to one or more embodiments.

Thereafter, the protruding portions of insulating material may be formed e.g. by a printing method which selectively prints the material of the protruding portions 810 in the recesses between adjacent metallization pads 425. According to embodiment, the protruding portions may be formed by screen printing an epoxy resin over the second main surface 120. According to further embodiments, a layer of the material may be formed, followed by a patterning process, e.g. by photolithographically patterning the material layer. As a result, the spaces between adjacent metallization pads 425 are filled by the protruding portions 810. According to some embodiments, as is shown in FIG. 12B, the protruding portions 810 may be formed so as to protrude above the metallization pad 425 and may cover edge regions of the metallization pad 425. According to a further example, as is shown in FIG. 12C, the metallization pad 425 may protrude above the protruding portion 810. In another embodiment, the protruding portion 810 may be flush with a metallization pad 425 so that an upper surface of the metallization pad 425 and of the protruding portion 810 may be approximately at the same level. Due to the presence of the protruding portions 810 on the second main surface, the semiconductor chip assembly or composite wafer may be mechanically stabilized during processing.

Figure 13A:
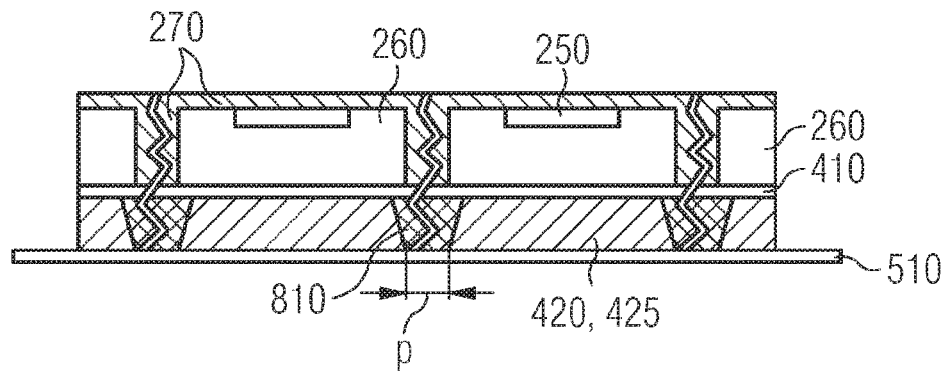
FIG. 13A illustrates a cross-sectional view of a portion of a semiconductor substrate according to one or more embodiments.

FIG. 13A illustrates a cross-sectional view of adjacent semiconductor chips 260 after performing a separation process. The separation process may be performed by a laser dicing process or a mechanical dicing process. The metallization layer of the semiconductor chips 260 is arranged on a separating carrier 510, the glass carrier is removed and the semiconductor chips 260 diced from the composite wafer by inserting a separation line into the sacrificial material 270 and protruding portion 810. The separation line has a width that is less than the width of the sacrificial material 270 so that sacrificial material may remain on at least portions of the side wall of the semiconductor chips 260. Due to the presence of the sacrificial material 270 on the sidewalls of the semiconductor chips 260, the semiconductor chips 260 are laterally insulated. Due to the presence of the protruding portions 810, the sidewalls of the metallization pad 425 of the patterned metallization layer 420 are protected. For example, a height of the protruding portion 810 may be approximately 8 to 10 μm. The protruding portion 810 may overlap with the metallization layer 420, 425 in a vertical direction so that the width of the protruding portion decreases and the width of the metallization pad 425 increases in a vertical direction away from the second surface. A thickness of the semiconductor chip 260 may be less than 100 μm, e.g. less than 50 μm or less than 20 μm. The thickness of the semiconductor chip 260 may be more than 1 μm or more than 5 μm.

Figure 13B:
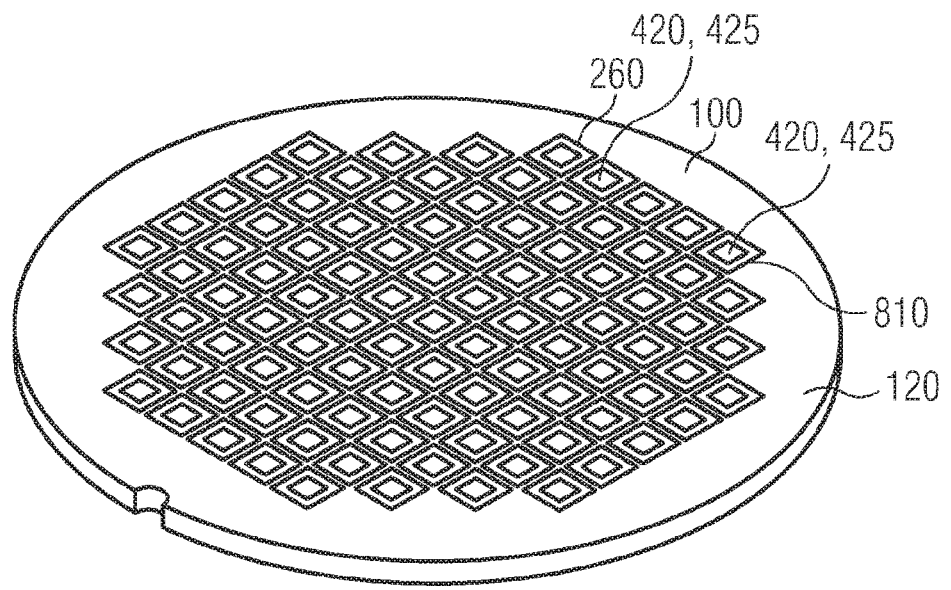
FIG. 13B illustrates a plan view of a portion of a semiconductor substrate according to one or more embodiments.

FIG. 13B illustrates a plan view of a second main surface 120 of a portion of a semiconductor substrate. As is shown, the protruding portions 810 are formed so as to enclose the central portion of a semiconductor chip 260. The protruding portion 810 may completely surround a semiconductor chip. The metallization layer 420, 425 is disposed in the central portion of each of the semiconductor chips 260.

Figure 13C:
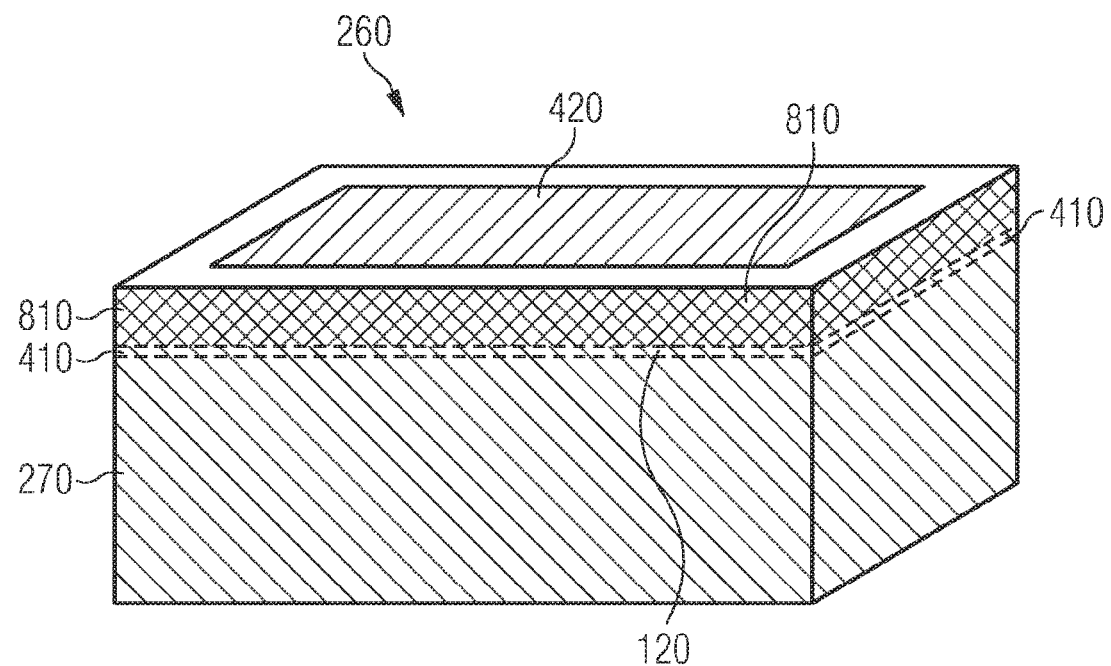
FIG. 13C illustrates a perspective view of a semiconductor chip according to one or more embodiments.

FIG. 13C illustrates a perspective view of a semiconductor chip 260 according to one or more embodiments. The semiconductor chip 260 includes an insulating material 270 disposed on a side wall of the semiconductor chip 260, the insulating material 270 extending from a first main surface 110 to a second main surface 120 of the semiconductor chip 260. The semiconductor chip 260 further includes portions 810 of an insulating material, protruding from the second main surface 120, the protruding portions 810 forming a closed loop along a sidewall of the semiconductor chip. In more detail, the protruding portions are arranged along an entire circumferential edge of the semiconductor chip 260 so as to enclose a central portion of the second main surface 120 of the semiconductor chip 260. Components of the semiconductor device 250 are formed in the first main surface 110. According to an embodiment, a metallization layer may be arranged over the second main surface. The protruding portions overlap with the metallization layer in a vertical direction. In some embodiments, portions of the seed layer 410 or residues of the seed layer 410 may be arranged between the insulating material 270 and the protruding portions 810. According to further embodiments, the insulating material 270 may directly contact the protruding portions 810.

FIG. 14 illustrates a method according to embodiments. As is shown, a method of manufacturing a semiconductor device includes forming (S100) a plurality of separation trenches in a first main surface of a semiconductor substrate, a bottom side of the separation trenches being disposed in the semiconductor substrate. The method further includes filling (S110) a sacrificial material in the separation trenches and removing (S120) substrate material from a second main surface of the semiconductor wafer to uncover a bottom side of the separation trenches and the sacrificial material. The method then includes forming protruding portions (S210) of an insulating material over the second main surface, the protruding portions being arranged at positions of the separation trenches and on the sacrificial material and forming a metallization layer (S220) over the second main surface. The method further includes mounting (S130) the semiconductor substrate 100 to a separating carrier so that a second main surface of the semiconductor substrate is disposed on the side of the separating carrier and, thereafter, isolating or separating (S140) the semiconductor substrate into a plurality of semiconductor chips. The protruding portions may be formed before forming the metallization layer, or the protruding portions may be formed after forming and patterning the metallization layer.

FIG. 15 illustrates a flow diagram 900 of a method for manufacturing a semiconductor device. In box 901, at least one trench is formed in a non-device region of a first surface of the semiconductor wafer. The non-device regions are arranged between component positions that include device regions and a first metallization structure. In box 902, a first polymer layer is applied to the first surface of the semiconductor wafer such that the trenches and edge regions of the component positions are covered with the first polymer layer and such that at least a portion of the first metallization structure is uncovered by the first polymer layer. In box 903, portions of second surface of the semiconductor wafer, which opposes first surface, are removed and portions of the first polymer layer in the non-device regions are revealed. In particular, the portion of the semiconductor wafer forming the base of the trench is removed so that portions of the first polymer layer arranged in the trenches are revealed to form a channel including the first polymer layer that extends from the first surface to the worked second surface and throughout the thickness of the wafer. In box 904, the first polymer layer arranged in the non-device regions is at least partially removed to form a plurality of separate semiconductor dies. The first polymer layer may be removed by cutting or sawing, for example.

In some embodiments, the polymer layer may be replaced by a sacrificial layer or an insulating layer.

Typically, the component positions are arranged in the semiconductor wafer in rows and columns. The non-device regions are arranged between and delineate neighbouring component positions such that the non-device regions when viewed form above form a pattern of orthogonally arranged stripes. The non-device regions may also be referred to as saw streets or kerfs. The first polymer layer arranged in the non-device regions also has the form of orthogonally arranged stripes.

The semiconductor wafer may also be referred to as a semiconductor substrate and may include a single crystal wafer, for example <100> Si. However, the semiconductor wafer may also include multiple layer structure including non-semiconductor materials such as a semiconductor on insulator structure.

The first polymer layer is inserted into the trenches and also onto the edge regions of the component positions and, in some embodiments, onto edge regions of the first metallization structure. However, at least a portion of the first metallization structure, such as a contact pad, remains uncovered by the first polymer layer. The first polymer layer has a patterned or structured form and is discontinuous. The portion of the first metallization structure which is uncovered by the first polymer layer may form the base of a square or rectangular recess including side walls formed by strips of the first polymer layer defining a continuous boundary around the uncovered area of the first metallization structure. The first metallization structure may not extend into the non-device region. In some embodiments, edge regions of the component positions may be free from the first metallization structure.

The first metallization structure may include multiple conductive and insulative layers with conductive vias extending through insulation layers arranged between the conductive layers to electrically couple the conductive layers. The outermost conductive layer may provide one or more contact pads. For example, for a transistor device, the outermost conductive layer of the first metallization structure may include a current electrode contact pad, for example a source contact pad, and a control electrode contact pad, for example a gate conduct pad in each component position. The first metallization structure may also be called a metallization layer or simply metallization.

The relative height between the first polymer layer and the first metallization layer may vary. In some embodiments, the first polymer layer has a greater height that the first metallization layer so that the first metallization layer or each pad may form the base of a recess that is surrounded and bounded on all lateral sides by portions of the first polymer layer. In some embodiments, the first polymer layer is arranged on edge regions of the first metallization layer in the device regions so that a central portion of the first metallization layer is uncovered by the first polymer layer and forms the base of a recess having side walls formed by portions of the first metallization layer arranged in the edge regions of the first metallization layer.

In some embodiments, the first polymer layer and the first metallization layer have substantially the same height and are substantially coplanar. In these embodiments, the first polymer layer may contact only the side faces of the first metallization layer so that the entire lateral extent of the first metallization layer is exposed from the first metallization layer.

The method may be described as a so-called "dicing before grinding" method. The trenches have a depth such that the base of the trench is formed by the portion of the semiconductor wafer. The trenches formed in the non-device regions of the first surface of the semiconductor wafer partially separate the component positions from the wafer. The depth of the trench from the first surface may be substantially the same as or, in some embodiments, greater than the desired final thickness of the semiconductor device which is to be formed from the component positions. Consequently, when the material is removed from the second surface of the semiconductor wafer and the thickness of the semiconductor wafer is reduced to the desired final thickness of the semiconductor devices, the polymer material arranged in the trenches is exposed in the worked second surface. The semiconductor material of the component positions is separated from the remainder of the semiconductor material of the wafer and is mechanically bound by the first polymer layer to form an article. Each of the separated regions of semiconductor material or component positions may provide a semiconductor die which may include one or more semiconductor devices, for example a transistor device, such as a MOSFET.

The resulting article or structure may be descried as a composite wafer in which component positions including semiconductor material are embedded in a matrix of the first polymer layer. The semiconductor dies and the first polymer layer and extend throughout the thickness of the composite wafer. The first polymer layer extends between the side faces of neighbouring semiconductor dies and over edge regions of the semiconductor dies of the component positions on the first surface. The worked second surface of the composite layer includes regions of semiconductor material laterally surrounded by polymer material. The composite wafer may then be worked to separate or singulate individual semiconductor dies from the composite wafer.

The individual semiconductor dies may be separated from the composite wafer by inserting a separation line into the first surface, in particular, into the non-device areas of the first surface. The separation line may have a width that is less than the width of the trench such that at least portions of side faces of the plurality of separate semiconductor dies include a portion of the first polymer layer. The separation line may be inserted by cutting, for example by mechanical cutting using a saw, or by laser cutting, for example.

The first polymer layer may include a polymer that may be cured with little or no shrink and, therefore, reduction in volume. The first polymer layer may be cured or cross-linked by application of heat and/or light, for example UV light. In some embodiments, the first polymer layer is a thermosetting polymer.

The first polymer layer may include a cross-linked polymer which cures without a polycondensation reaction and may be solvent-free. Such materials may be cured with little or no shrink or reduction in volume and without the formation of gases. Therefore, void formation, particularly in the portion of the material arranged in the trenches can be avoided. In some embodiments, the first polymer layer may be an epoxy layer.

The first polymer layer may include a solvent-free multi-component thermosetting epoxy in an uncured or partially cured state. The first polymer layer may include a filler or may filler-free. The first polymer layer may be electrically insulative.

The first polymer layer may be applied to the first surface of the semiconductor wafer by printing and may be applied as a patterned or structured layer. After application, the first polymer layer may be at least partially cured, for example by applying heat and/or UV light.

The first metallization structure may include a redistribution structure includes two or more metal layers separated from one another by insulating material or inter layer dielectric material which are electrically coupled together by conductive vias. The outermost metallic layer may provide contact pads. In the case of a transistor, the outermost metallic layer may provide a large current electrode contact pad, which may be coupled to source, and a smaller control electrode contact pad, which may be coupled to gate, for example.

A carrier may be attached to the first surface of the semiconductor wafer to provide support whilst portions of the second surface of the semiconductor wafer are removed. The carrier may be a glass carrier, for example. The carrier may be attached by an adhesive layer.

The adhesive layer may compensate for any topology of the first surface. For example in embodiments in which the first polymer layer covers edge regions of the first metallization structure and is therefore positioned in a plane above that of the outermost surface of the first metallization layer so that the first metallization layer forms the base of a recess in the first polymer layer, the adhesive may fill the recess.

The second surface of the semiconductor wafer may be removed by grinding and/or chemical mechanical polishing, for example. In some embodiments, a combination of grinding and/or chemical mechanical polishing followed by etching may be used. A wet chemical etching or plasma etching process may be used. Etching may be used to remove material which exhibits damage caused by the mechanical or chemical mechanical grinding processes.

In some embodiments, the worked second surface of the semiconductor wafer may be further processed before the semiconductor devices are separated from the composite semiconductor wafer.

In some embodiments, one or more conductive layers are applied to the worked second surface to form a second metallization structure. The second metallization structure may extend continuously over the worked second surface and extend over the semiconductor material and over the first polymer layer.

Portions of the second metallization layer may be removed from the first polymer layer arranged in the non-device regions to produce discrete conductive portions in the device regions on the worked second surface.

For example, a second metallization structure may be applied to at least the device regions of the semiconductor dies in the component positions of the second surface of the semiconductor wafer. The second metallization structure may provide a ground plane or an electrode in the case of a vertical device such as a vertical transistor or a vertical diode.

For a vertical device, the second metallization structure may be coupled to the second current electrode, for example drain in the case of a MOSFET transistor, and provide a second current electrode contact pad.

In some embodiments, after removal of the second metallization structure from the first polymer layer in the non-device regions, a portion of the first polymer layer arranged in the non-device regions is also removed to produce a recess surrounding the semiconductor dies at the worked second surface.

In some embodiments, a second polymer layer is applied to the worked second surface to cover at least the first polymer layer arranged in the non-device regions.

The composition of the second polymer layer may be the same as the composition of the first polymer layer or may be different. In some embodiments, both the first polymer layer and the second polymer layer include epoxy.

Portions of the second metallization structure may remain uncovered by the second polymer layer. In some embodiments, edge regions of the semiconductor dies in the component positions are uncovered by the second metallization structure and covered by the second polymer layer.

In embodiments included first and second polymer layers arranged on opposing sides of the semiconductor dies, a composite wafer is formed in which at least edge regions of the two opposing sides of the semiconductor dies are covered with an polymer material which also extends onto the side faces of the semiconductor dies. The first polymer layer and the second polymer layer provide a matrix in which the semiconductor dies are embedded and in which at least portions of the metallization structure on two opposing surfaces of the semiconductor dies remain uncovered and exposed. The second polymer layer may be in contact with the portions of the first polymer layer arranged and extending between side faces of neighbouring semiconductor dies. The first polymer layer and the second polymer layer may together fill the regions between side faces of the individual semiconductor dies in the component positions.

In some embodiments, a second polymer layer is applied to the worked second surface before a second metallization structure is applied such that the first polymer layer arranged in the non-device regions is covered by the second polymer layer and such that regions of the worked second surface comprising semiconductor material are uncovered by the second polymer layer.

In some embodiments, the second polymer layer may be applied to the worked second surface after the second metallization structure such that the first polymer layer and edge regions of the discrete conductive portions of the second metallization structure are covered with the second polymer layer and such that regions of the discrete conductive portions of the second metallization structure are exposed from the second polymer layer.

After application, the second polymer layer may be partially or fully cured, for example by the application of heat and/or UV light. The second polymer layer may be applied using a printing technique, for example. The second polymer layer may be selectively applied to produce the desired pattern directly or may be applied as a continuous layer and portions removed to produce the desired pattern.

In some embodiments, a conductive sublayer, for example a seed layer, is applied to the worked second surface and the second polymer layer is applied to the seed layer such that the first polymer layer arranged in the non-device regions is covered by the seed layer and the second polymer layer and such that regions of the seed layer in the device regions are uncovered by the second polymer layer.

The second metallization structure may be built up by applying one or more conductive layers to the seed layer in the regions of the worked second surface that are uncovered by the second polymer layer to form discrete conductive portions bounded by the second polymer layer to form a second metallization on the semiconductor dies.

In embodiments, in which a conductive sublayer is applied to the worked second surface and the second polymer layer is applied to the conductive sublayer, the conductive sublayer is positioned underneath the second polymer layer and between the first and second polymer layers in the non-device regions. The conductive sublayer may serve as an electrode for the selective deposition of the conductive layer may be applied to the regions of the worked second surface that are uncovered by the second polymer layer in order to form discrete conductive portions bounded by the second polymer layer and a second metallization on the semiconductor dies.

The patterned second polymer layer provides a mask for determining the position of the discrete conductive portions and the second metallization structure on the semiconductor dies.

The second metallization structure may be built up to a thickness that is the same as or less than the thickness of the second polymer layer. In some embodiments, the conductive layer may be built up to a thickness that is greater than the thickness of the second polymer layer.

The semiconductor dies may be separated from the composite wafer by cutting along the non-device regions and therefore by cutting through the first polymer layer and the second polymer layer if present arranged between the side faces of adjacent semiconductor dies. At least portions of the first polymer layer and second polymer layer may be remain on the side faces of the semiconductor dies after separation or singulation and may provide electrical insulation.

Various embodiments of methods for manufacturing a composite wafer are now described with reference to FIGS. 16A to 16E.

Figure 16A:
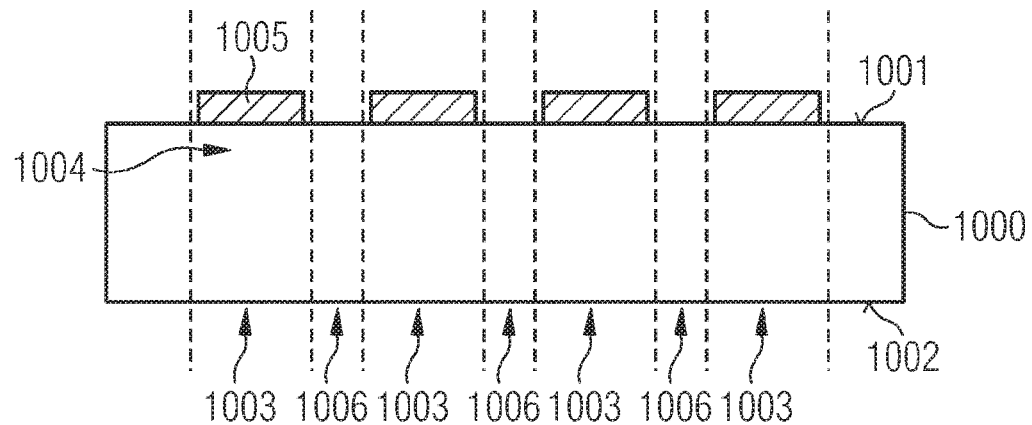
FIGS. 16A to 16F illustrate methods for processing a semiconductor wafer.

FIG. 16A illustrates a semiconductor wafer 1000 having a first surface 1001 and a second surface 1002 which opposes the first surface 1001. The first surface 1001 includes a plurality of component positions 1003 including device regions 1004 and a first metallization structure 1005 arranged on the first surface 1001 in the device regions. The semiconductor wafer 1000 may be a silicon single crystal wafer. The device regions 1004 may include structures suitable for producing a transistor device, such as a vertical MOSFET or a superjunction MOSFET.

Neighbouring component positions 1003 are separated and spaced apart by non-device regions 1006. The interface between neighbouring component positions 1003 and the non-device regions 1006 is indicated by dashed lines and illustrates that the non-device regions 1006 have a width. The component positions 1003 are typically arranged in rows and columns so that the non-device regions 1006 have the form of an orthogonal grid in plan view. The non-device regions 1006 may also be referred to as saw streets or kerfs. The semiconductor wafer 1000 may include hundreds or thousands of component positions 1003. In some embodiments, each component position 1003 will provide a single semiconductor die which may include one or more semiconductor devices such as a transistor device, for example, a vertical transistor. The first metallization structure 1005 may include a multi-layer structure including one or more conductive layers with intervening insulation and/or passivation layers, whereby the conductive layers may be electrically coupled by one or more conductive vias. The metallization structure 1005 may not extend to the boundary of the component positions 1003.

Some semiconductor devices such as vertical transistors may desirably have a thickness of less than 100 µm and may have a thickness of around 20 µm, for example. In order to facilitate the production of the device regions 1004 and first metallization structure 1005, the semiconductor wafer 1000 may have an initial thickness ti which is substantially greater than the final desired thickness of the semiconductor devices. For example, the semiconductor wafer 1000 may have thickness of around 700 µm. After processing to form the device regions 1004 and the first metallization structure 1005 on the first surface 1001, the thickness of the semiconductor wafer 1000 may be reduced by removing portions of the second surface 1002. The thickness of the semiconductor wafer 1008 may be reduced by mechanical grinding and/or chemical mechanical polishing the second surface 1002, for example, to produce a worked second surface.

Figure 16B:
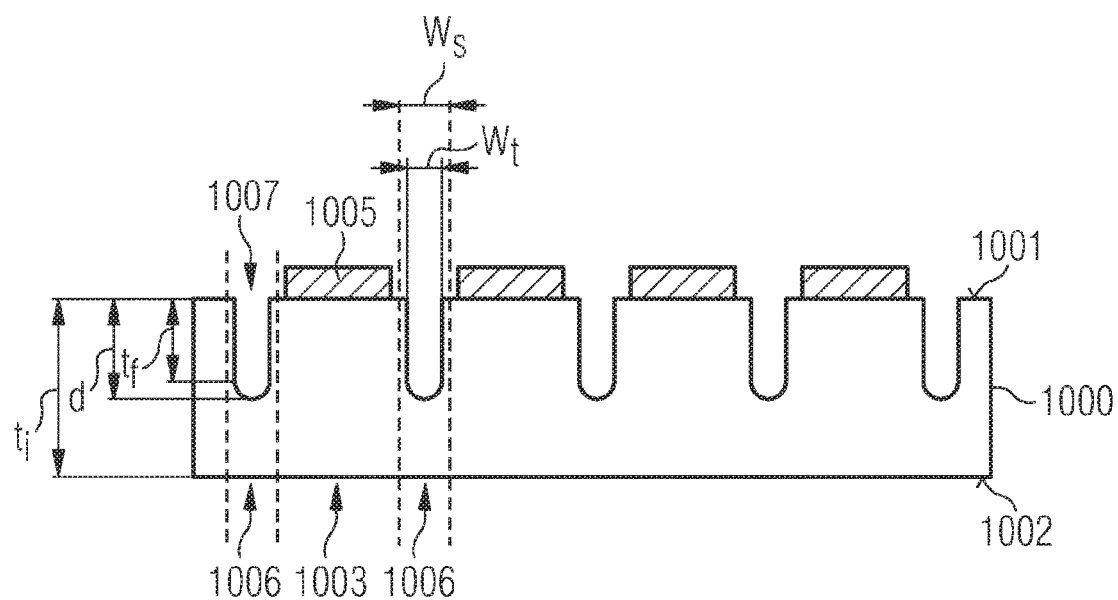

FIG. 16B illustrates the semiconductor wafer 1000 after the introduction of trenches 1007 into the non-device regions 1006 in the first surface 1001. The trenches 1007 are inserted to a depth d which is less than the initial thickness ti of the semiconductor wafer 1000 and therefore have side faces and a base formed by the material of the semiconductor wafer 1000. The depth d of the trenches 1007 may be selected to be roughly the same as or greater than the desired final thickness $t_f$ of the semiconductor devices. The trenches 1007 may have a width wt that this less than the width $w_3$ of the non-device regions 1006. The device regions 1004 and the component positions 1003 are held together within the semiconductor wafer 1000 by the remaining portions of semiconductor wafer 1000.

The initial thickness ti of the semiconductor wafer 1000 may be around 700 µm and the depth d of the trenches 1007 may be around 30 µm to 35 µm for semiconductor devices having a final thickness $t_f$ of around 20 µm. The first metallization structure may have a total thickness $t_m$ of around 10 µm.

Figure 16C:
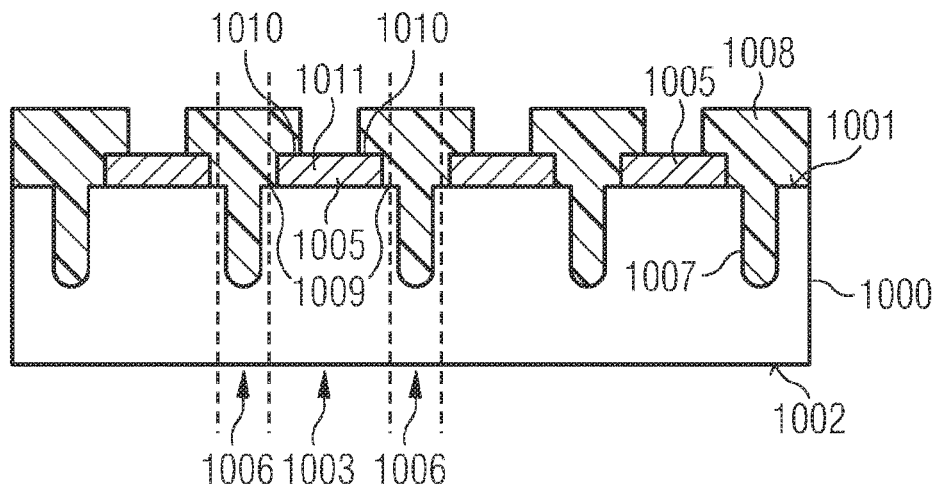

FIG. 16C illustrates the semiconductor wafer 1000 after the application of a first polymer layer which may be an epoxy layer 1008, for example, to the first surface 1001 and, in particular, into the trenches 1007. The first epoxy layer 1008 has a lateral extent on the first surface 1001 such that it is positioned on edge regions 1009 of the component positions 1003 and edge regions 1010 of first metallization structure 1005. Portions 1011 of the first metallization structure 1005 remain uncovered by the first epoxy layer 1008. The first epoxy layer 1008 may be applied in a pattern to the first surface 1001 using techniques such as printing, for example, and cured by applied heat and/or light. In some embodiments, the first epoxy layer 1008 may be applied as a continuous closed layer and then structured to remove portions and expose portions 1011 of the first metallization structure 1005 in the device regions 1003. In plan view, or when viewed from the top, the first epoxy layer 1008 may have the form of orthogonal stripes surrounding square or rectangular regions of first metallization structure 1005 such that the first metallization structure 1005 in the component positions 1003 is covered in the edge regions 1009 by portions of the first epoxy layer 1008. The first epoxy layer 1008 protrudes above the exposed portions 1011 of the first metallization structure 1005. The exposed portions 1011 of the first metallization structure 1005 form the base of recesses formed above the device regions 1004 in the first epoxy layer 1004.

Figure 16D:
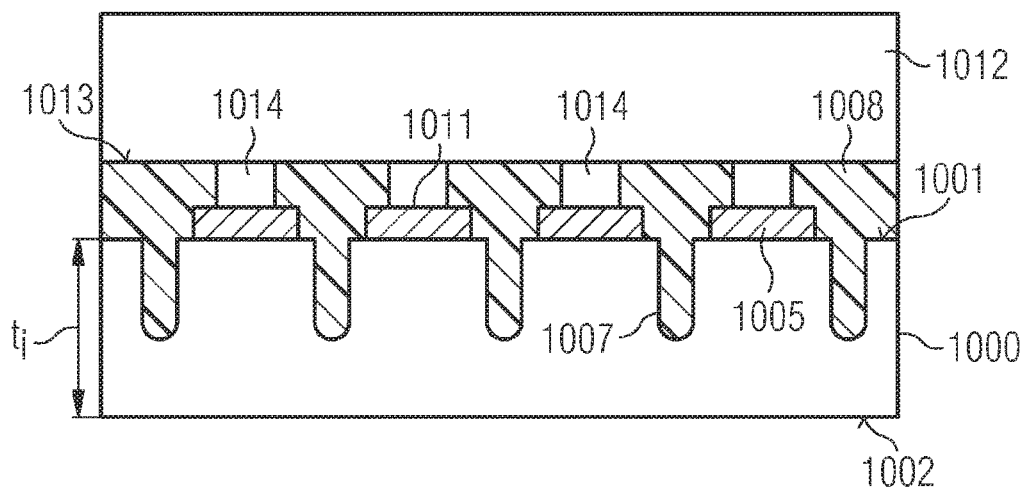

FIG. 16D illustrates the semiconductor wafer 1000 after a carrier 1012 has been attached to the first surface 1001 and, in particular, to the outermost surface 1013 of the first epoxy layer 1008.

The carrier 1012 may be a glass carrier and may be attached to the outermost surface 1013 of the first epoxy layer 1008 by a further adhesive layer not illustrated in the drawings.

In some embodiments, such as that illustrated in FIG. 16D, the first epoxy layer 1008 has a structured form and protrudes above the first metallization structure 1005, regions 1014, which are formed between the exposed regions 1011 of the first metallization structure 1005 and the carrier 1012 and bounded on the sides by the first epoxy layer 1008, may be filled by the further adhesive layer.

Figure 16E:
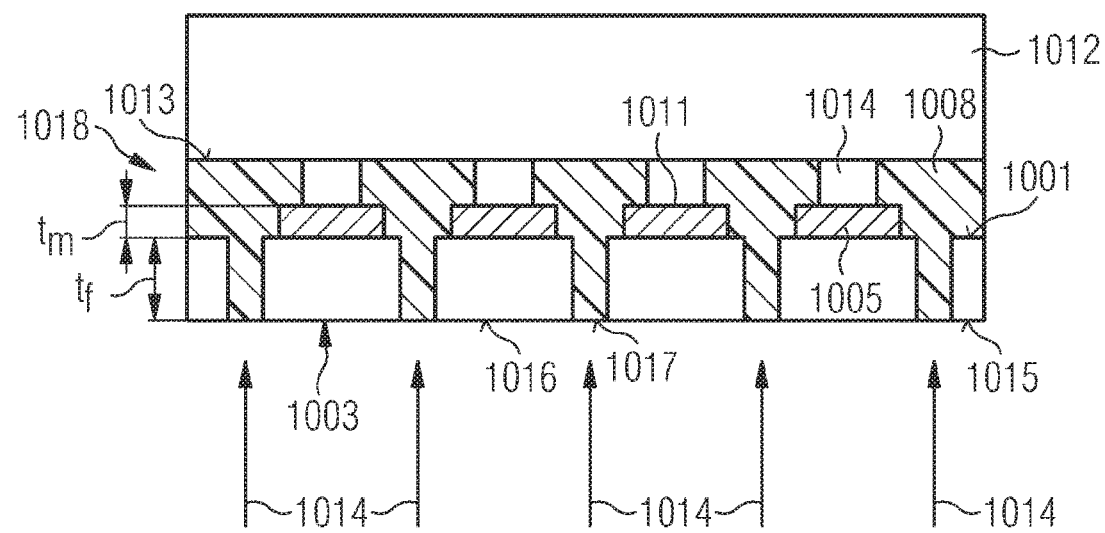

FIG. 16E illustrates the removal of portions of the second surface 1002 of the semiconductor wafer 1000 as indicated schematically by the arrows 1014 to produce a worked second surface 1015 including semiconductor material portions 1016 surrounded on all sides by portions 1017 of the epoxy layer 1008 that were arranged in the trenches 1007. The worked second surface 1015 may include isolated portions of semiconductor material 1016 mechanically held together and spaced apart by regions of the first epoxy layer 1008. This structure may be called a composite wafer 1018. At this stage, the component positions 1003 have been separated from the wafer and form semiconductor dies as they are no longer mechanically connected to one another by regions of a semiconductor material. The thickness of the semiconductor wafer 1000 may reduced to $t_f$ which may be around 20 µm.

In some embodiments, the carrier 1012 may be removed, and the semiconductor devices separated or singulated from the composite wafer 1018 by removing the first epoxy layer 1008 or by cutting through the epoxy layer 1008.

Figure 16F:
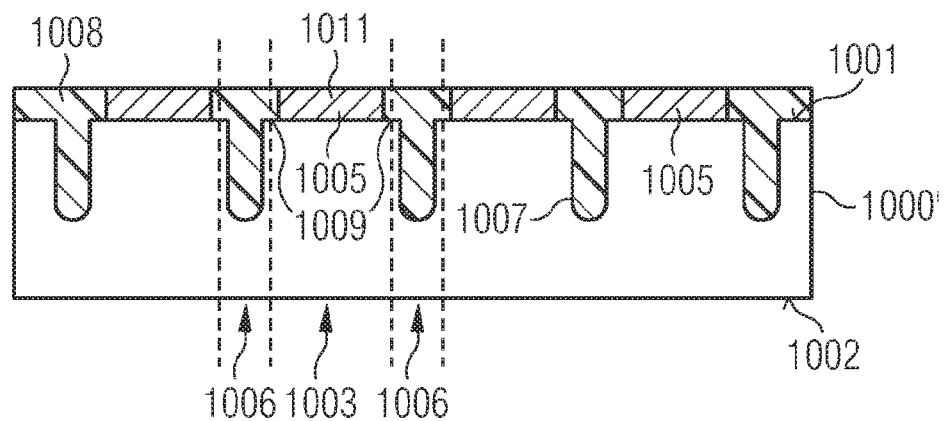

FIG. 16F illustrates a semiconductor wafer 1000' that includes a plurality of component positioned 1003 spaced from their immediate neighbours by a non-device region 1006 or kerf. Trenches 1007 are arranged in the non-device regions 1006. The arrangement of the first epoxy layer 1008 with respect to the first metallization structure 1005 differs from that of the embodiment illustrated in FIG. 16C. The first epoxy layer 1008 is inserted into the trenches 1007 and may fill the trenches 1007 and the space between the discrete portions of the first metallization structure 1005 arranged in the device regions of the component positions 1003. The edge regions 1009 of the component positions are covered by the first epoxy layer 1008. The entire lateral extent of the first metallization structure 1005 is exposed from the first epoxy layer 1008. The outermost surface 1013 of the first epoxy layer 1008 is substantially coplanar with the outermost surface of the first metallization structure 1005 so that sides faces of the first metallization structure 1005 are bordered by the first epoxy layer. The first epoxy layer 1008 may be considered to act as a planarization layer.

In some embodiments, further processing of the rear surface 1016 of the component positions is not required so that the composite wafer 1018 having the structure illustrated in FIGS. 16E and 16F may be singulated.

In some embodiments, a second metallization structure may be applied to the worked second surface 1015. FIGS. 17A to 17E illustrate methods for fabricating a semiconductor device, in particular a semiconductor device including a metallization structure on two opposing surfaces. The semiconductor device may be a vertical device, i.e. a device having a drift path between two opposing major surfaces. Examples of a vertical device include a vertical diode and a vertical transistor.

Figure 17A:
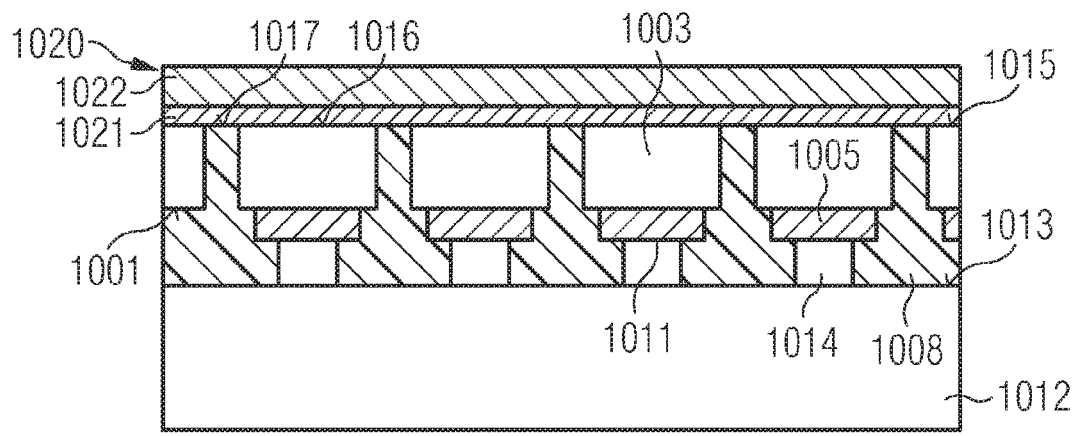
FIGS. 17A to 17E illustrate methods for fabricating a semiconductor device.

FIG. 17A illustrates the semiconductor wafer after the application of a continuous and closed second metallization structure 1020 to the worked second surface 1015. The second metallization structure 1020 may include a seed layer 1021 which is applied to the second surface 1015 by vacuum deposition techniques, such as physical vapour deposition, for example sputtering, or chemical vapour deposition. The second metallization structure 1020 may include one or more further layers 1022 which are deposited on the seed layer 1021 using the same or different techniques. For example, the one or more further metallic layers 1022 may be deposited onto the seed layer 1021 by electroplating. The total thickness of the second metallization structure 1020 may be around the same total thickness as the first metallization structure 1008 on the opposing side of the component positions. In some embodiments, the semiconductor material may have a thickness around 20 µm, the first metallization structure 1005 may have a thickness of around 10 µm and the second metallization structure 1020 may have thickness of around 10 µm.

Figure 17B:
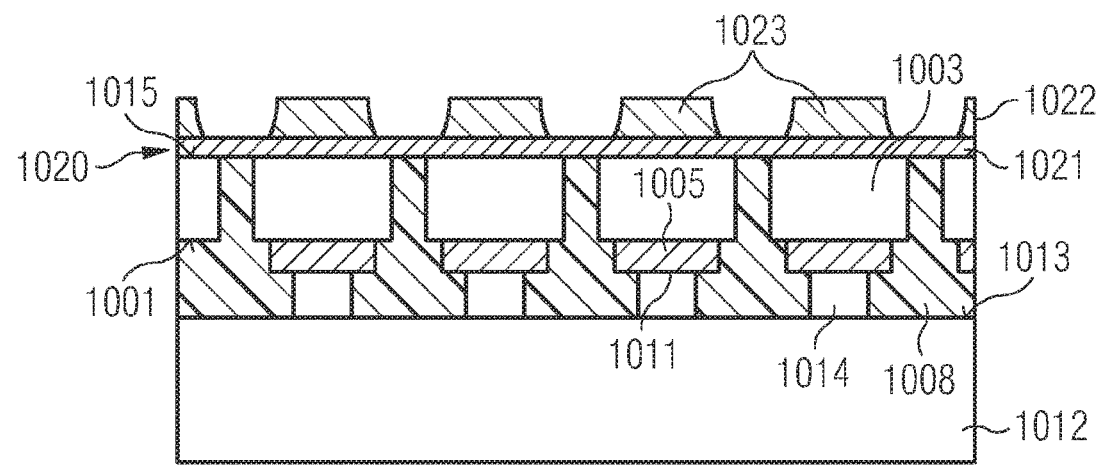

FIG. 17B illustrates a view of the semiconductor wafer 1000 after further processing of the second metallization structure 1020 to remove portions of the thicker metallization layer 1022 in the non-device regions 1006 and in regions above the first epoxy layer 1008. The second metallization structure 1020 may be structured using a mask and etching away portions of the second metallization structure exposed from the mask. Discrete portions 1023 of the second metallization structure 1020 are formed on the device regions 1003. In some embodiments, the underlying regions of the first epoxy layer 1008 are exposed. In some embodiments, the seed layer 1021 remains as a continuous layer on the worked second surface 1015. The seed layer 1021 may include a metal which is capable of acting as an etch stop. For example, the seed layer 1021 may include titanium and the metallization layer 1022 may include copper. The lateral extent of the remaining portions 1023 of the metallization layer 1022 may be slightly less than the lateral extent of the semiconductor material of the component positions 1003.

In some embodiments, the seed layer 1021 is also removed from the surface 1017 formed by the first epoxy layer 1008 arranged in the trenches. Edge regions and side faces of the semiconductor material at the second surface 1015 may be exposed from the first epoxy layer 1008 as well as from the second metallization structure 1020 including the seed layer 1021.

Figure 17C:
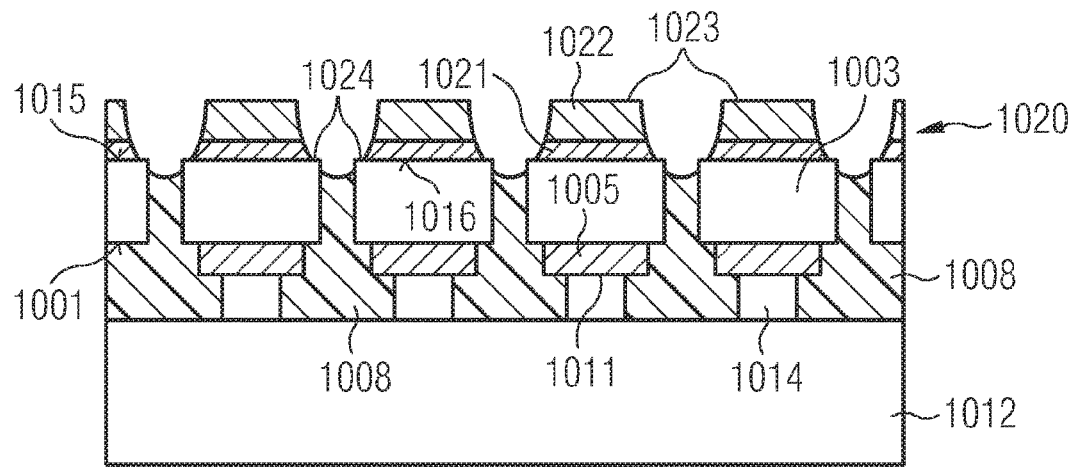

FIG. 17C illustrates an embodiment in which the seed layer 1021 and further layer(s) 1022 of the second metallization structure 1020 are removed from the non-device regions 1006 of the worked second surface 1015 such that portions of the first epoxy layer 1008 arranged in the trenches 1007 and edge regions 1024 of the second surfaces 1016 including semiconductor material are exposed from the seed layer 1021 and the second metallization layer 1022. Outermost portions of the first epoxy layer 1008 are also removed so that a portion of the side faces of the semiconductor material of the component positions 1003 adjacent the worked surface 1015 are exposed. The metallization structure 1020 includes a plurality of separate discrete regions 1023 each including the seed layer 1021 and a metallization layer 1022 arranged on the second surfaces 1016 of the component positions 1003 in the device regions 1004.

Figure 17D:
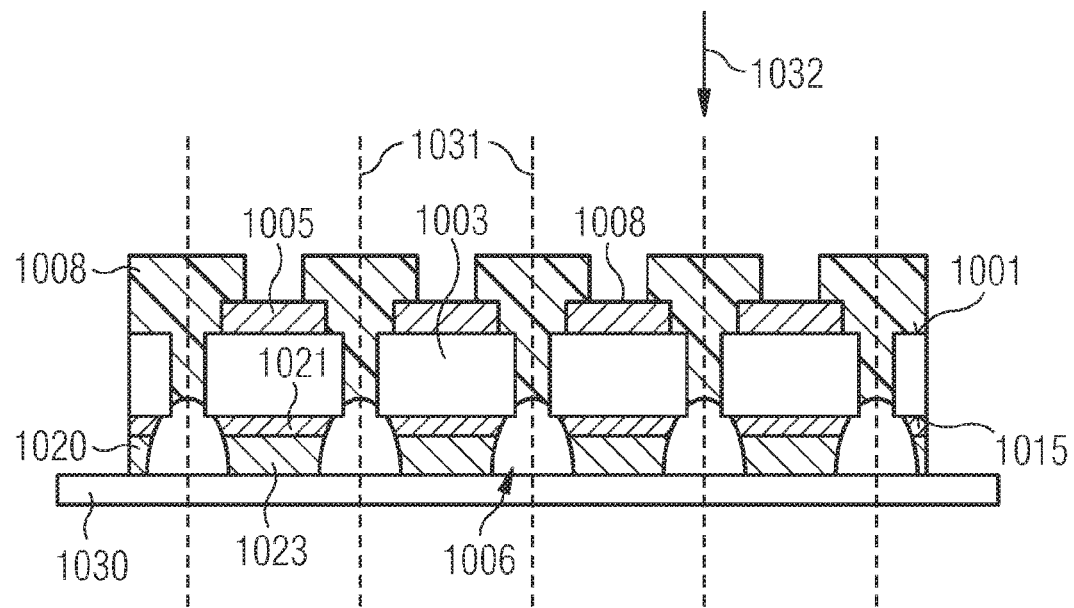

In order to separate or singulate the semiconductor devices from the composite wafer, the carrier 1012 may be removed from the first surface 1001 and from the first epoxy layer 1008, a further carrier 1030, such as a tape or foil may be attached to the second metallization structure 1020, the composite wafer inverted, as illustrated in FIG. 17D. The semiconductor devices may be separated from the composite wafer by inserting a separation line 1031 or removing material along the separation line 1031 in the non-device regions 1006 through the first epoxy layer 1008 from the first surface 1002 to the second surface 1015. The separating line may be inserted by cutting, for example sawing using a diamond saw, or laser sawing, as indicated schematically in FIG. 17D by arrow 1032.

Figure 17E:
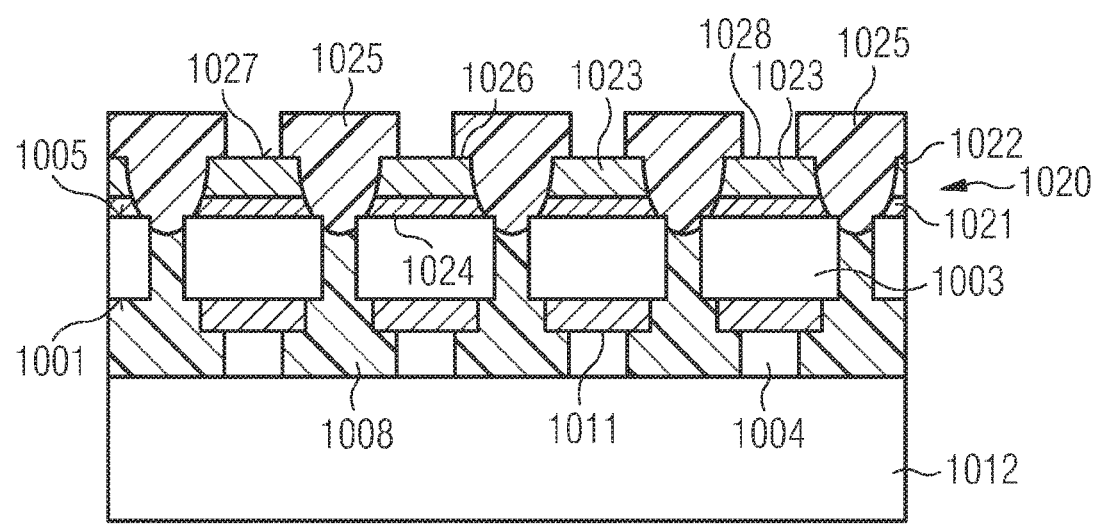

In some embodiments, such as that illustrated in FIG. 17E, a second polymer layer 1025 is applied to the worked second surface 1015 of the composite wafer. The second polymer layer 1025 may include epoxy, for example. The second epoxy layer 1025 may be selectively applied to the non-device regions 1006 such that the second epoxy layer 1025 is arranged between neighbouring component positions 1003 and is in contact with the first epoxy layer 1008 arranged between the semiconductor device positions 1003. The second epoxy layer 1025 may have the form of an orthogonal grid of striped portions. The striped portion may have a width w that is greater than the width $w_f$ of the underlying portion of the first epoxy layer 1008 so that the second epoxy layer 1025 overlaps edge regions 1026 of the outer surface 1027 of the second metallization structure 1020. The second epoxy layer 1025 may also be arranged on edge regions 1024 of the semiconductor material and on edge regions 1026 of the portions 1023 of the second metallization structure. Portions 1028 of the second metallization structure 1020, for example central regions of the portions 2013, remain uncovered by the second epoxy layer 1025 and form a base of a recess bounded by walls provided by the second epoxy layer 1025. The arrangements of the first epoxy layer 1008 and the second epoxy layer with respect to the non-device regions 1006 may be substantially vertically aligned with one another.

This structure may be considered to be a composite wafer which includes semiconductor dies of the component positions 1003 embedded in a matrix including the first epoxy layer 1008 and the second epoxy layer 1025. Edge regions 1010 of the first metallization structure 1005 and edge regions 1009 of the first surface of the semiconductor material are covered by the first epoxy layer 1008. Edge regions 1026 of the second metallization structure 1023 and edge regions 1024 of the second surface 1016 of the semiconductor material are covered by the second epoxy layer 1025. The semiconductor material of a component position 1003 extends through the thickness of the composite wafer and is spaced apart from semiconductor material of immediate neighbouring ones of the component portions 1003 by the first and second epoxy layers 1008, 1025. In this embodiment, the non-device regions 1006 include only epoxy material and, in particular, first epoxy layer 1008 and the second epoxy layer 1025.

In order to produce separate devices from the composite wafer, the outermost surface 1028 of the second epoxy layer 1025 may be attached to a carrier foil or tape, the carrier 1012 removed, the composite wafer inverted and individual devices separated from the composite wafer by cutting or sawing in the non-device regions 1006 by inserting the cutting line into the first surface 1002. The non-device regions 1006 include only epoxy material which may assist in achieving a well-defined and accurately positioned cut.

In some embodiments, the second epoxy layer 1025 protrudes above the outermost surface 1027 of the second metallization structure 1020 and may be used as a solder resist layer.

Figure 18:
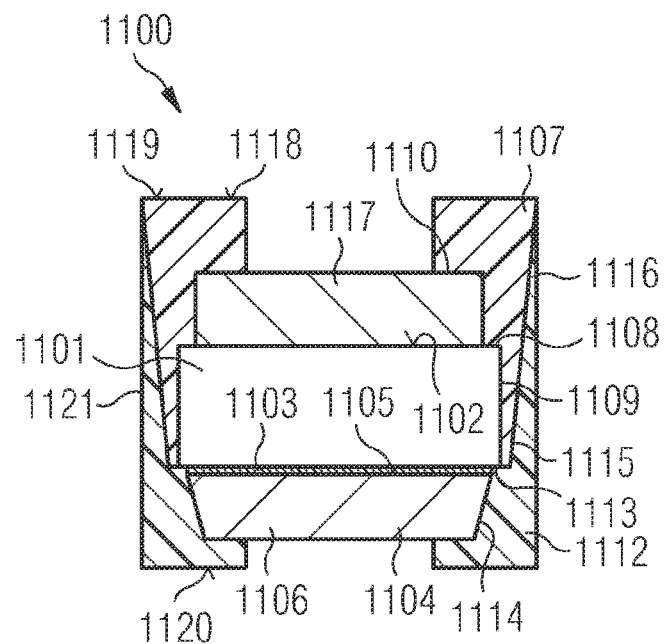
FIG. 18 illustrates a cross-sectional view of a semiconductor device according to an embodiment.

FIG. 18 illustrates an example of a semiconductor device 1100 which may be singulated from the composite wafer having the structure illustrated in FIG. 17D. The semiconductor device 1100 may be singulated from the composite wafer by inserting a separation line, for example using a saw, into the non-device positions 1006 through the entire thickness of the first epoxy layer 1008 and second epoxy layer 1025.

The semiconductor device 1100 includes a semiconductor die 1101 having a first surface 1102 on which a first metallization structure 1117 is arranged. The semiconductor die 1101 has a second surface 1103 opposing the first surface 1102 including a second metallization structure 1104 which may include a seed layer 1105 arranged on the semiconductor material of the second surface 1103 and one or more further metallic sublayers 1106 arranged on the seed layer 1105. The semiconductor device 1100 includes a first epoxy layer 1107 which is arranged on edge regions 1108 of the first surface 1102 and side faces 1109 of the semiconductor die 1101 and may also extends onto edge regions 1110 of the first metallization structure 1117.

The first epoxy layer 1107 may cover the entire side face 1109 of the semiconductor die 1101 but may have varying thickness. In particular, the thickness may be greater adjacent the first surface 1102 than adjacent second surface 1103. The semiconductor component 1100 may also include a second epoxy layer 1112 which is arranged on edge regions 1113 of the second surface 1103 and on side faces 1114 of the second metallization structure 1104 and which is positioned on the outermost surface 1115 of the first epoxy layer 1107 in regions adjacent side face 1109 of the semiconductor die 1101. The interface 1116 between the first epoxy layer 1107 and the second epoxy layer 1112 may be inclined and may be inclined outwardly in a direction from the second surface 1130 to the second surface 1102. The first epoxy layer 1107 and the second epoxy layer 1112 may provide an encapsulant for protecting the side faces and edge regions of the semiconductor die 1101.

The outermost upper 1118 plane of the electronic component 1100 may be provided by portions of the first epoxy layer 1107. The outermost lower plane 1119 of the semiconductor component 1100 may have different forms. In some embodiments, the outermost lower plane 1119 may include regions of the second metallization structure 1104 and regions of the second epoxy layer 1112 which are substantially coplanar.

The planar surface regions 1120 of the first epoxy layer 1107 and planar surface regions 1121 of the second epoxy layer 1112 may have a surface roughness which is less than the surface roughness of the side faces 1122. The side faces 1122 may have a surface structure characteristic of working and in particular characteristic of the separation method used to separate the semiconductor devices 1100 from the composite wafer. For example, in embodiments in which the composite wafer is singulated using a mechanical saw, the side faces 1122 may include cutting marks. In embodiments in which laser ablation is used to separate the composite wafer into separate devices, the side faces 1122 may include burn marks.

In some embodiments, the second surface 1015 of composite wafer is subjected to processing such that a conductive seed layer 1021 is applied to the worked second surface 1015 and the second epoxy layer 1025 is applied onto the seed layer 1021.

Figure 19:
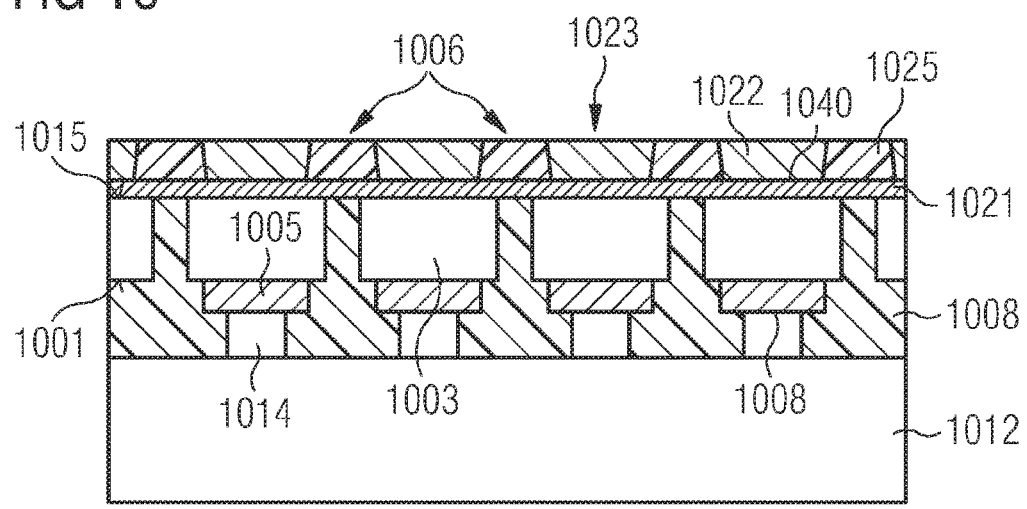
FIG. 19 illustrates a cross-sectional view of a composite wafer according to an embodiment.

FIG. 19 illustrates a cross-sectional view of a composite wafer according to an embodiment in which the worked second surface 1015 of the composite wafer is processed such that a conductive seed layer 1021 is applied to the worked second surface 1015 including the regions of semiconductor material and the first epoxy layer 1008. Afterwards, the second epoxy layer 1025 is applied onto the seed layer 1021. The second epoxy layer 1025 may be selectively applied, for example by printing, to the non-device regions 1006. The second epoxy layer 1025 may have to form of a grid of orthogonal elongate stripes in plan view. The lateral extent of each of the stripes w may be slightly larger or wider than the width $w_f$ of the first epoxy layer 1008 arranged between the component positions. The thickness of the second metallization structure 1020 may then be increased by applying the second metallization layer 1022 onto the regions 1040 of the second surface 1015 which remain uncovered by the second epoxy layer 1025, in particular onto the regions 1040 of the seed layer 1021 which remain uncovered by the second epoxy layer 1025.

Since the seed layer 1021 is continuous on the second surface 1017, the seed layer 1021 may act as an electrode in an electroplating method with which the second metallization layer 1022 is deposited. The thickness of the layer 1022 and of the second metallization structure 1020 may be increased to the desired thickness and in some embodiments increased such that the outermost surface is substantially coplanar with the outermost surface of the second epoxy layer 1025. In some embodiments, the thickness may be increased sufficiently such that the thickness of the second metallization structure 1020 is greater than the thickness of the second epoxy layer 1025. In some embodiments, edge regions of the second epoxy layer 1025 may be covered by the second metallization structure 1020.

In embodiments in which the metallization layer 1022 is deposited after application of the patterned second epoxy layer 1025, side faces of the separate areas 1023 of the second metallization structure 1020 are bordered by the second epoxy layer 1025. The second epoxy layer 1025 may be used as a mask to define the lateral extent of the second metallization structure 1020.

Figure 20:
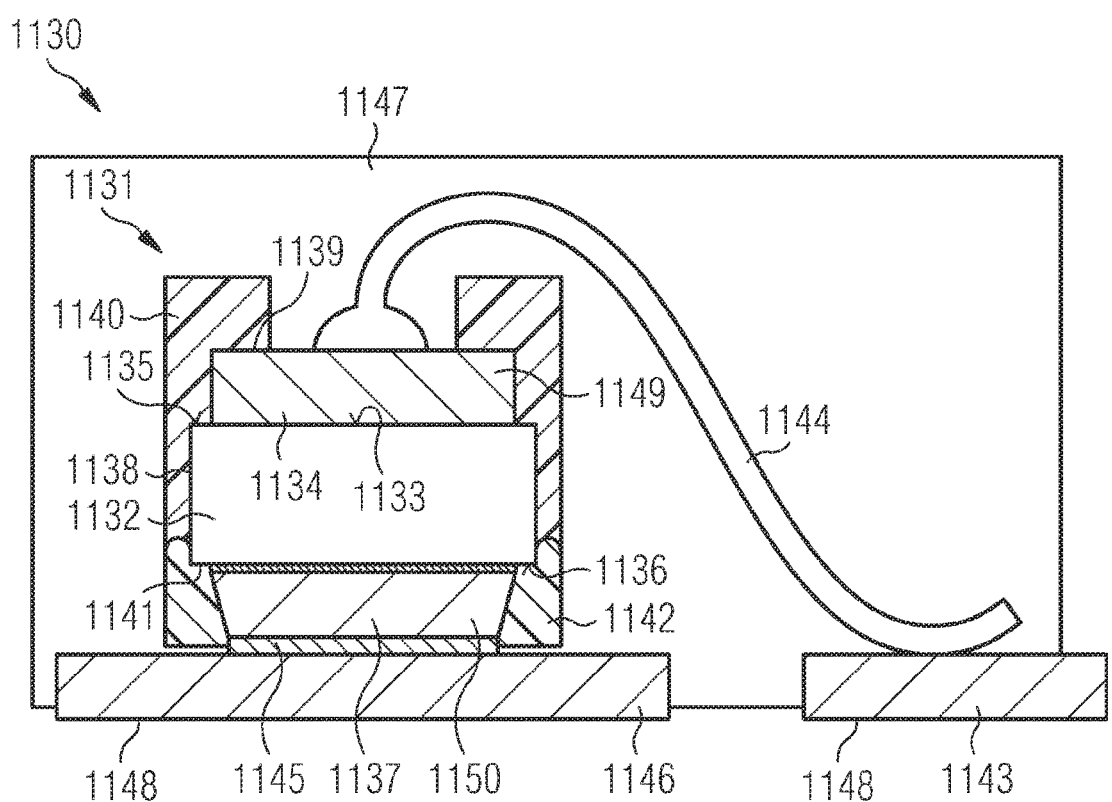
FIG. 20 illustrates a cross-sectional view of an electronic component according to an embodiment.

FIG. 20 illustrates a cross-sectional view of an electronic component 1130 including a semiconductor device 1131. However, the electronic component 1130 may include a semiconductor device according to any one of the embodiments described herein or fabricated using any one of the methods described herein.

The semiconductor device 1131 may include a semiconductor die 1132 including a first surface 1133 with a first metallization structure 1134 and edge regions 1135 that surround the first metallization structure 1134, a second surface 1136 opposing the first surface 1133 and with a second metallization structure 1137, and side faces 1138. The edge regions 1135 of the first surface 1133, edge regions 1139 of the first metallization structure 1134 and portions of the side faces 1138 are covered by a first epoxy layer 1140. Edge regions 1141 of the second surface 1136 and portions of the side faces 1138 adjacent the second surface 1136 are covered by a second epoxy layer 1142. The second epoxy layer 1142 is in contact with the first epoxy layer 1140.

The electronic component 1130 also includes a plurality of leads. The first metallization structure 1134 is coupled to a first lead 1143, for example by a connector 1144 such as one or more bond wires or a contact clip, and the second metallization structure 1137 is coupled to a second lead 1146 of the plurality of leads. The electronic component 1130 may also include a plastic housing composition 1147 that covers the first epoxy layer 1140 and the second epoxy layer 1142 and portions of the plurality of leads.

The second lead 1146 may be a die pad so that the semiconductor device 1131 is mounted on and the second metallization structure 1137 is coupled to the die pad, for example by a layer of solder 1145. In embodiments, in which the second epoxy layer 1142 protrudes below the lowermost plane of the second metallization structure 1137, the second epoxy layer 1142 may act to control the lateral extent of the solder connection by containing the solder 1145 within side faces bordering the second metallization structure 1137.

The first lead 1143 may be spaced apart from the second lead 1146. In some embodiments two or more leads may be arranged adjacent, and spaced apart from, one or more side faces of a die pad. Each lead of the electronic component 130, and a die pad if present, may include a surface that is exposed from the plastic housing composition 1147 and provide an outer contact pad 1148 for the electronic component 1130.

The semiconductor device 1131 may be a vertical transistor, such as a MOSFET, for example a superjunction MOSFET. The first metallization structure 1134 may include a source pad 1149 and a gate pad, that cannot be seen in the cross-sectional view of FIG. 20, that are coupled to two different leads. The second metallization structure 1145 may provide a drain pad 1150 which is mounted on the second lead 1146 This arrangement of the semiconductor device may be known as "drain down".

The first and second epoxy layers 1140, 1142 may provide an inner encapsulant for at least the side faces 1138 of the semiconductor die 1132 and be arranged within the plastic housing composition 1147 providing the housing of the electronic component 1130. The electronic component 1030 may have a package that conforms to a JEDEC standard, for example a TO252 package.

In some embodiments, the semiconductor device 1131 may be a vertical transistor and may be mounted in a so-called "source down" arrangement.

Figure 21:
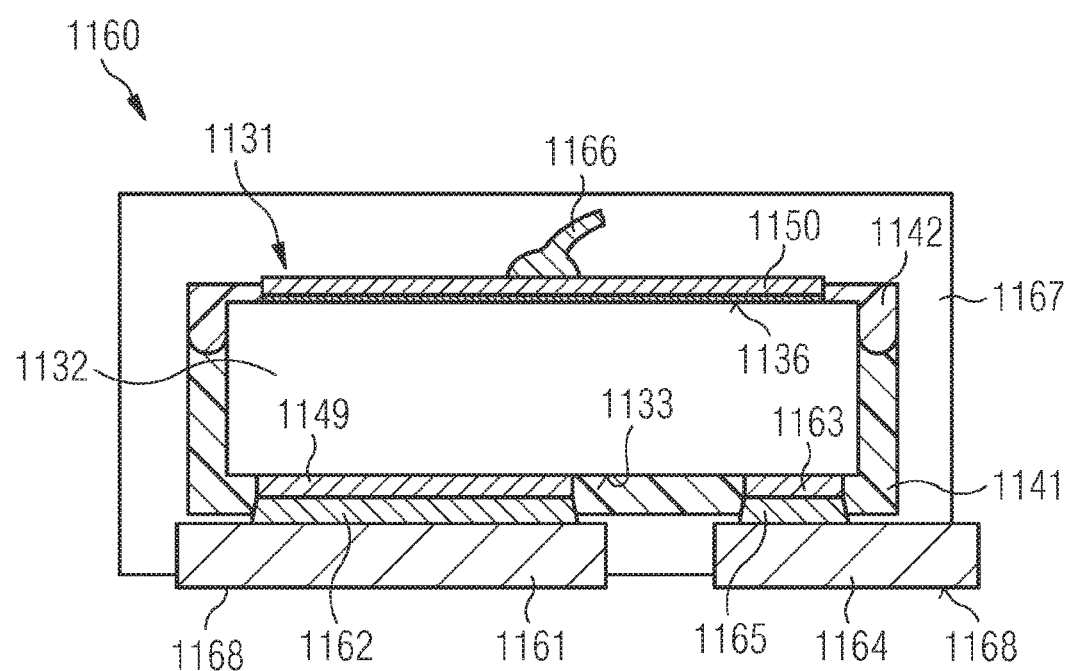
FIG. 21 illustrates a cross-sectional view of an electronic component according to an embodiment.

FIG. 21 illustrates a cross-sectional view of an electronic component 1160 including the semiconductor device 1131 including a vertical transistor having a "source down" arrangement. The source pad 1149 is positioned and mounted on a first lead 1161 by a layer of solder 1162. The gate pad 1163 is arranged on the same surface 1133 of the semiconductor die 1132 as the source pad 1149 and is positioned and mounted on a second lead 1164 by a layer of solder 1165. The second lead 1164 is substantially coplanar with, and spaced part from, the first lead 1161. The semiconductor device 1131 extends between the first lead 1161 and the second lead 1164. The drain pad 1150 faces upwardly away from the first lead 1161 and is coupled to a third lead, which cannot be seen in the cross-sectional view of FIG. 21, by a connector 1166 such as a bond wire or clip. The third lead is spaced apart from the die pad 1161 and the second lead 1164.

The electronic component 1160 also includes a plastic housing composition 1167 providing the housing of the electronic component 1160. Portions of the leads 1161, 1164 and the die pad 1161 are exposed from the plastic housing composition 1167 to provide outer contacts 1168 for the electronic component 1160.

The first and second epoxy layers 1140, 1142 may provide an inner encapsulant for at least the side faces 1138 of the semiconductor die 1132 and be arranged within the plastic housing composition 1167. The first epoxy layer 1141 may act to control the spread of the solder 1162, 1165 from the source pad 1149 and gate pad 1163, respectively, for example in embodiments in which the first epoxy layer 1041 borders the side faces of the source pad 1149 and gate pad 1163.

While embodiments of the invention have been described above, it is obvious that further embodiments may be implemented. For example, further embodiments may include any subcombination of features recited in the claims or any subcombination of elements described in the examples given above. Accordingly, this spirit and scope of the appended claims should not be limited to the description of the embodiments contained herein.

What is claimed is:

1. An electronic component, comprising: a semiconductor device including a semiconductor die including a first surface, the first surface including a first metallization structure and edge regions surrounding the first metallization structure, a second surface opposing the first surface and including a second metallization structure, and side faces, wherein the edge regions of the first surface and portions of the side faces are covered by a first polymer layer, wherein edge regions of the second surface and portions of the side faces are covered by a second polymer layer, wherein the second polymer layer is in contact with the first polymer layer, wherein the electronic component further comprises a plurality of leads and a plastic housing composition, wherein the first metallization structure is coupled to a first lead and the second metallization structure is coupled to a second lead of the plurality of leads, wherein the plastic housing composition covers the first polymer layer and the second polymer layer.

2. The electronic component of claim 1, wherein the second lead is a die pad, and wherein the semiconductor device is mounted on and the second metallization structure is coupled to the die pad by solder.

3. The electronic component of claim 2, wherein the second polymer layer protrudes below a lowermost plane of the second metallization structure, and wherein the second epoxy layer contains the solder within the side faces bordering the second metallization structure.

4. The electronic component of claim 1, wherein each lead of the electronic component includes a surface that is exposed from the plastic housing composition and provides an outer contact pad for the electronic component.

5. The electronic component of claim 1, wherein the plastic housing composition provides a housing of the electronic component, and wherein the first and the second polymer layers provide an inner encapsulant for at least the side faces of the semiconductor die and are arranged within the plastic housing composition providing the housing of the electronic component.

* * * * *